(12) United States Patent
Masuo et al.

(10) Patent No.: US 7,697,320 B2
(45) Date of Patent: Apr. 13, 2010

(54) SEMICONDUCTOR MEMORY DEVICE

(75) Inventors: Akira Masuo, Osaka (JP); Norihiko Sumitani, Osaka (JP); Kazuki Tsujimura, Osaka (JP); Tsuyoshi Koike, Osaka (JP)

(73) Assignee: Panasonic Corporation, Osaka (JP)

( * ) Notice: Subject to any disclaimer, the term of this patent is extended or adjusted under 35 U.S.C. 154(b) by 158 days.

(21) Appl. No.: 12/122,174

(22) Filed: May 16, 2008

(65) Prior Publication Data

US 2009/0016144 A1      Jan. 15, 2009

(30) Foreign Application Priority Data

Jul. 12, 2007   (JP) .............................. 2007-182972

(51) Int. Cl.
*G11C 11/40* (2006.01)
(52) U.S. Cl. .................. 365/154; 365/156; 365/190
(58) Field of Classification Search .................. 365/156
See application file for complete search history.

(56) References Cited

U.S. PATENT DOCUMENTS

| | | | |
|---|---|---|---|
| 6,590,802 B2 * | 7/2003 | Nii .............................. | 365/156 |
| 6,738,306 B2 * | 5/2004 | McLaury ................ | 365/230.05 |
| 6,741,517 B1 * | 5/2004 | Fisher et al. ............ | 365/230.05 |
| 7,274,589 B2 * | 9/2007 | Asayama et al. ............. | 365/154 |
| 7,286,390 B2 | 10/2007 | Yokoyama | |
| 7,295,459 B2 * | 11/2007 | Islam ......................... | 365/156 |
| 7,313,021 B2 | 12/2007 | Horiuchi | |
| 7,471,544 B2 * | 12/2008 | Nakazato et al. ............ | 365/154 |
| 7,606,062 B2 * | 10/2009 | Hsu et al. .................... | 365/154 |
| 2008/0159051 A1 * | 7/2008 | Kato ...................... | 365/230.05 |

FOREIGN PATENT DOCUMENTS

JP        02-94196        4/1990

* cited by examiner

*Primary Examiner*—Tan T. Nguyen
(74) *Attorney, Agent, or Firm*—McDermott Will & Emery LLP

(57) ABSTRACT

In a memory cell having a first and a second load transistor, a first and a second drive transistor, and a first and a second access transistor, a third access transistor provided between a first bit line and a first memory node and having a gate terminal connected to a first column line and a fourth access transistor provided between a second bit line and a second memory node and having a gate terminal connected to a second column line, are additionally provided.

36 Claims, 27 Drawing Sheets

US 7,697,320 B2

SEMICONDUCTOR MEMORY DEVICE

BACKGROUND OF THE INVENTION

1. Field of the Invention

The present invention relates to a semiconductor memory device, and more particularly to a memory cell circuit and a control circuit that is used during a write operation.

2. Description of the Related Art

Conventionally, there is a known semiconductor memory device in which an access transistor is provided between a memory node of a memory cell and a bit line, and the access transistor is controlled using a word line (see Japanese Unexamined Patent Application Publication No. H02-094196 and U.S. Pat. No. 7,313,021).

There is also a known technique in which a path between a P-channel MOS transistor of a memory cell and a memory node is interrupted so as to expand a write voltage operation range of an SRAM (Static Random Access Memory) (see U.S. Pat. No. 7,286,390).

SUMMARY OF THE INVENTION

In the above-described conventional techniques, when a word line selected using a row address is activated, the access transistors of memory cells on the same row are all activated. Also, in the conventional technique in which a path between a P-channel MOS transistor of a memory cell and a memory node is interrupted, the P-channel MOS transistors of memory cells on the same row are all interrupted.

However, when a plurality of columns of memory cells are connected to one input/output circuit, a Static Noise Margin (SNM) cannot be compensated for on a bit line (column) that is not selected, disadvantageously leading to an erroneous operation.

An object of the present invention is to prevent an erroneous operation on a non-selected column even in a configuration in which one input/output circuit is provided for a plurality of columns in a memory cell array having memory cells arranged in a matrix, while expanding an operating voltage margin during writing of data of a semiconductor memory device.

To achieve the object, a semiconductor memory device according to an aspect of the present invention comprises a memory cell array including a plurality of memory cells arranged in a matrix of rows and columns, a plurality of word lines provided with respect to the rows of the memory cells, including a first word line, a plurality of bit lines provided with respect to the columns of the memory cells, including a first and a second bit line, and a plurality of column lines provided with respect to the columns of the memory cells, including a first and a second column line. Each of the memory cells includes a latch circuit having a first and a second memory node, a first access transistor provided between the corresponding first bit line of the bit lines and the first memory node and controlled by the corresponding first word line of the word lines, a second access transistor provided between the corresponding second bit line of the bit lines and the second memory node and controlled by the first word line, a third access transistor provided between the first bit line and the first memory node and having a gate terminal connected to the first column line, and a fourth access transistor provided between the second bit line and the second memory node and having a gate terminal connected to the second column line.

A semiconductor memory device according to another aspect of the present invention comprises a memory cell array including a plurality of memory cells arranged in a matrix of rows and columns, a plurality of word lines provided with respect to the rows of the memory cells, including a first word line, and a plurality of bit lines provided with respect to the columns of the memory cells, including a first and a second bit line. Each of the memory cells includes a latch circuit having a first and a second memory node, a first access transistor provided between the corresponding first bit line of the bit lines and the first memory node and controlled by the corresponding first word line of the word lines, a second access transistor provided between the corresponding second bit line of the bit lines and the second memory node and controlled by the first word line, a third access transistor provided between the first bit line and the first memory node and having a gate terminal connected to the first memory node, and a fourth access transistor provided between the second bit line and the second memory node and having a gate terminal connected to the second memory node.

With these configurations, during a write operation with respect to a selected memory cell, the contribution of the third or fourth access transistor facilitates writing to the latch circuit. Under other conditions, an erroneous operation can be prevented in a non-selected column, particularly in the case of a configuration in which a plurality of input/output circuits including a first input/output circuit are provided with respect to the memory cell array, and a plurality of columns of memory cells are connected to one input/output circuit. In other words, when a configuration is employed in which a plurality of columns of memory cells are connected to the first input/output circuit while expanding an operating voltage margin during a data write operation, the area of an SRAM can be reduced.

Therefore, according to the present invention, an erroneous operation can be prevented in a non-selected column even when a plurality of columns of memory cells are connected to one input/output circuit, while expanding an operating voltage margin during a write operation in a semiconductor memory device. Therefore, in an SRAM, a configuration can be employed in which a plurality of columns of memory cells are connected to one input/output circuit, resulting in a reduction in area.

DETAILED DESCRIPTION OF THE PREFERRED EMBODIMENTS

Hereinafter, embodiments of the present invention will be described in detail with reference to the accompanying drawings. Note that like parts are indicated by like reference symbols and will not be repeatedly described.

Figure 1:
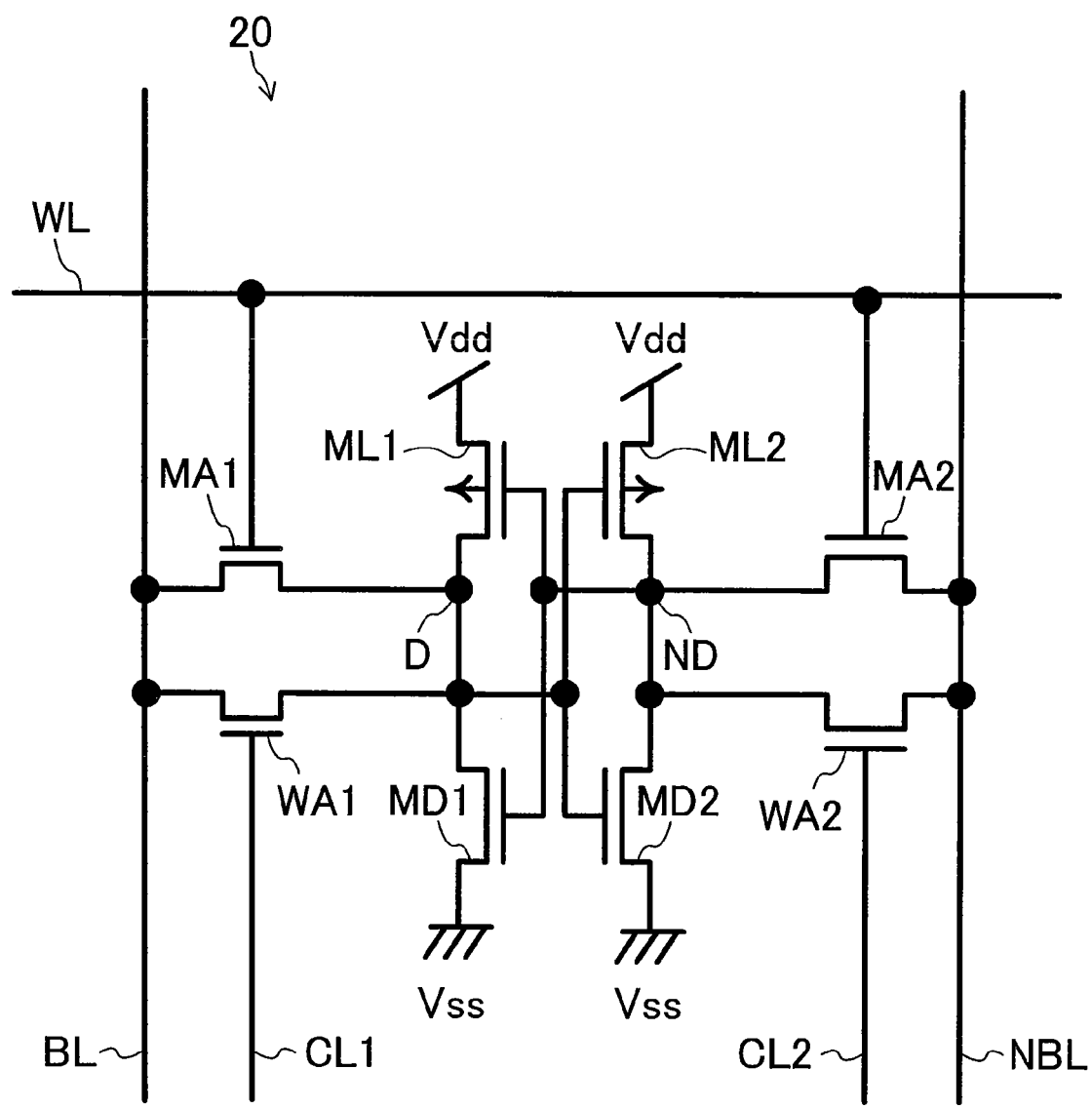
FIG. 1 is a diagram showing a first exemplary configuration of a memory cell in an SRAM that is a semiconductor memory device according to an embodiment of the present invention.

FIG. 1 shows a first exemplary configuration of a memory cell in an SRAM that is a semiconductor memory device according to an embodiment of the present invention. The memory cell 20 of FIG. 1 is a memory cell for storing complement data at first and second memory nodes D and ND, and comprises first and second load transistors ML1 and ML2, first and second drive transistors MD1 and MD2, first and second access transistors MA1 and MA2, and third and fourth access transistors (write assisting transistors) WA1 and WA2.

Specifically, the first load transistor ML1 is a P-channel MOS transistor that has a drain terminal connected to the first memory node D, a source terminal to which a power supply voltage Vdd is supplied, and a gate terminal connected to the second memory node ND. The second load transistor ML2 is a P-channel MOS transistor that has a drain terminal connected to the second memory node ND, a source terminal to which the power supply voltage Vdd is supplied, and a gate terminal connected to the first memory node D. The first drive transistor MD1 is an N-channel MOS transistor that has a drain terminal connected to the first memory node D, a source terminal connected to a ground voltage Vss, and a gate terminal connected to the second memory node ND. The second drive transistor MD2 is an N-channel MOS transistor that has a drain terminal connected to the second memory node ND, a source terminal connected to the ground voltage Vss, and a gate terminal connected to the first memory node D. The first access transistor MA1, which is an N-channel MOS transistor, is provided between the first memory node D and a first bit line BL, and the second access transistor MA2, which is an N-channel MOS transistor, is provided between the second memory node ND and a second bit line NBL. The first and second access transistors MA1 and MA2 each have a gate terminal connected to a word line WL.

The third and fourth access transistors WA1 and WA2 are N-channel MOS transistors that are provided between the first bit line BL and the first memory node D and between the second bit line NBL and the second memory node ND, respectively. The third and fourth access transistors WA1 and WA2 have gate terminals connected to first and second column lines CL1 and CL2, respectively.

Figure 2:
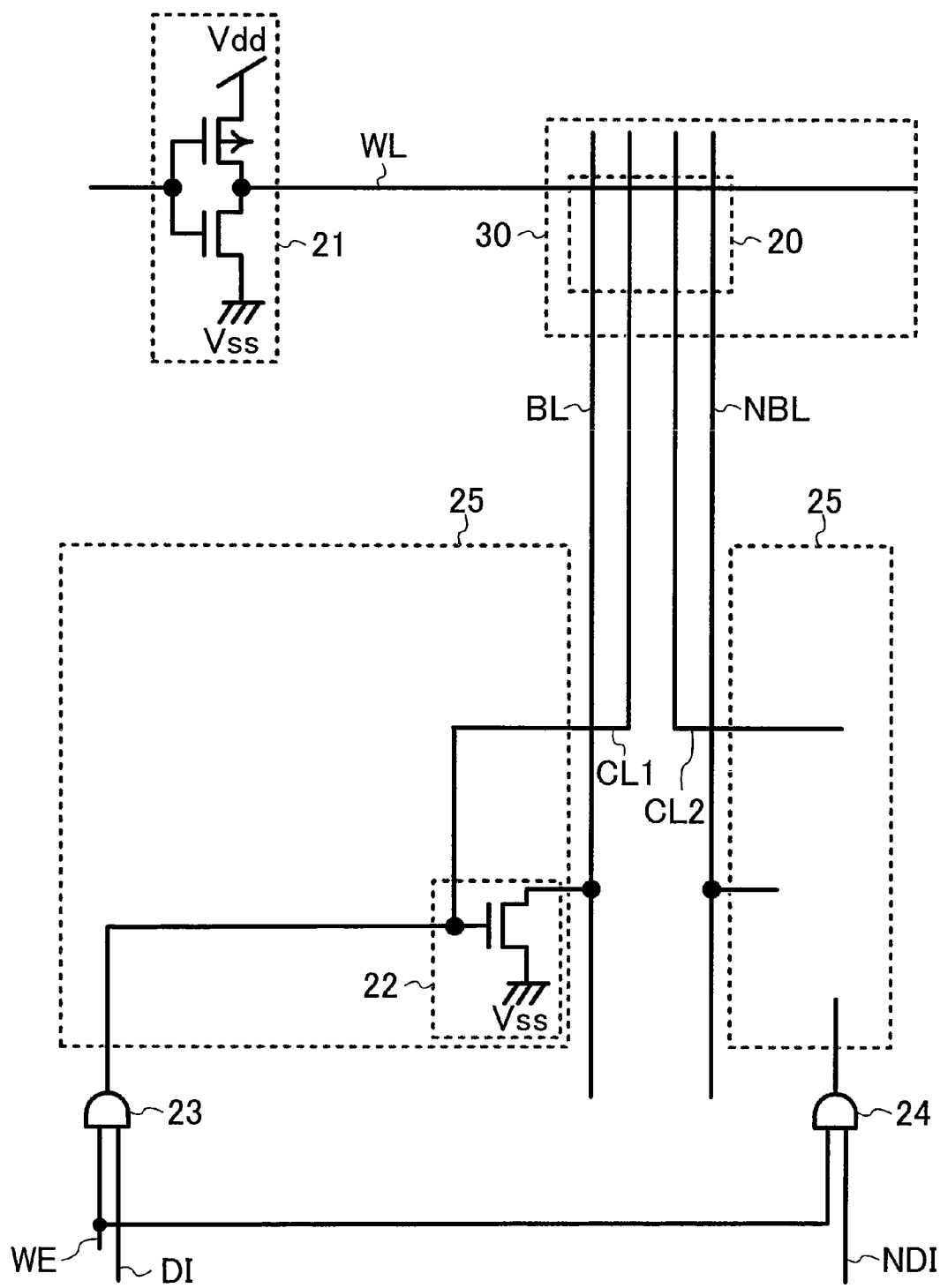
FIG. 2 is a diagram showing a first schematic exemplary configuration involved with a data write operation of an SRAM including the memory cell of FIG. 1.

FIG. 2 shows a first schematic exemplary configuration involved with a data write operation of an SRAM including the memory cell 20 of FIG. 1. Components for reading data, such as a sense amplifier and the like, are not shown. In FIG. 2, 21 indicates a word line driver, 22 indicates a write driver, 25 indicates write circuits, and 30 indicates a memory cell array.

The word line driver 21 drives the word line WL. The word line WL is connected to the first and second access transistors MA1 and MA2. The write driver 22 drives the first bit line BL. When the first column line CL1 is activated, the write driver 22 is turned ON, so that the first bit line BL goes to a Low-level potential (hereinafter denoted as "L") and the third access transistor WA1 is turned ON. The write circuits 25 are identical circuits that are provided for the first and second bit lines BL and NBL. In FIG. 2, a configuration involved with the second bit line NBL is not shown. The write circuit 25 includes the write driver 22, and a gate terminal of the write driver 22 and the gate terminal of the third access transistor WA1 are connected together as the same node. The memory cell array 30 includes a plurality of memory cells 20 each having the configuration of FIG. 1 that are arranged in a matrix. Memory cells 20 on the same row share a word line WL, and memory cells 20 on the same column share a first bit line BL, a second bit line NBL, and first and second column lines CL1 and CL2. Note that only one memory cell 20 is shown in FIG. 2 for the sake of simplicity. A two-input AND circuit 23 receives a write enable signal WE and a first write data line DI, and a two-input AND circuit 24 receives the write enable signal WE and a second write data line NDI. Note that the gate terminal of the write driver 22 and the gate terminal of the third access transistor WA1 may be different nodes as long as they have the same logical value. Although the write driver 22 includes an N-channel MOS transistor, the write driver 22 may have other configurations.

Figure 3:
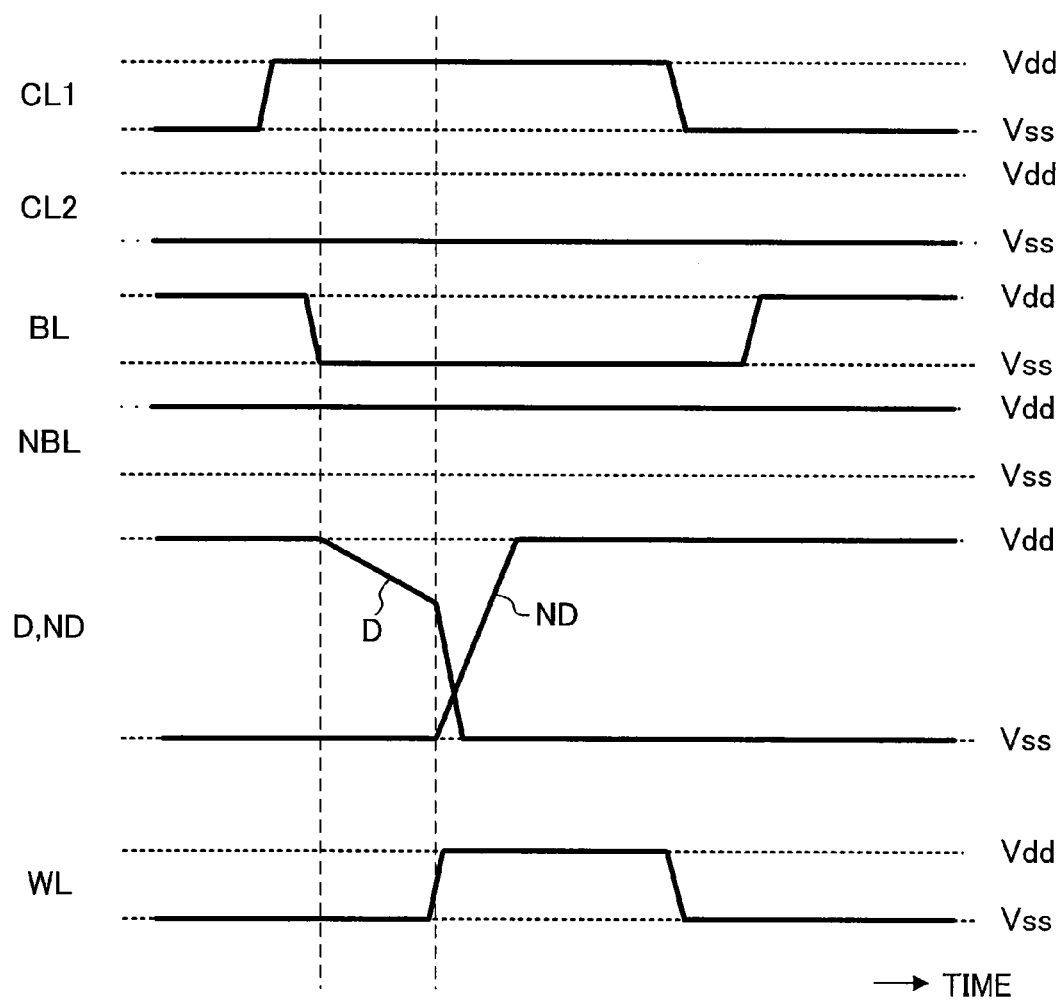
FIG. 3 is a timing diagram of FIG. 2.
Figure 4:
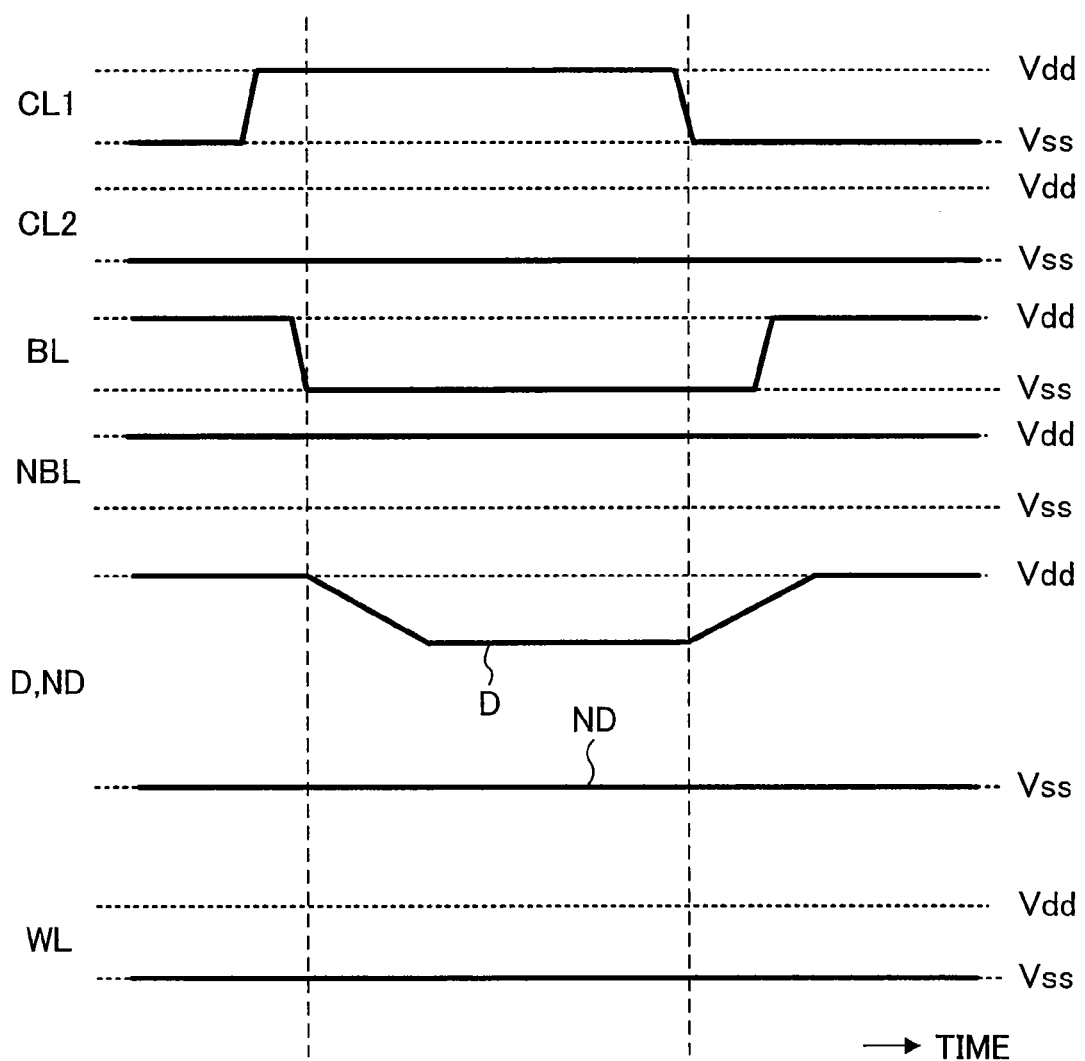
FIG. 4 is another timing diagram of FIG. 2.

FIGS. 3 and 4 are timing diagrams of the first schematic exemplary configuration involved with a data write operation of an SRAM including the memory cell 20 of FIG. 1. Here, the following six states will be described:

(i) a word line is selected, a bit line is selected, and inverted data is written <FIG. 3>;

(ii) a word line is selected, a bit line is selected, and the same data is written;

(iii) a word line is selected, and a bit line is not selected (i.e., a column is not selected);

(iv) a word line is not selected, a bit line is selected, and inverted data is written <FIG. 4>;

(v) a word line is not selected, a bit line is selected, and the same data is written; and (vi) a word line is not selected, and a bit line is not selected (i.e., a column is not selected).

(i) A word line is selected, a bit line is selected, and inverted data is written:

It is assumed that data at the first memory node D is "H" and data at the second memory node ND is "L". Specifically, when the first memory node D holds an "H" level and the second memory node ND holds an "L" level, the word line WL is activated, and "L"-level data is input to the first bit line BL and "H"-level data is input to the second bit line NBL. This corresponds to a write operation for a selected memory cell.

Waveforms shown in FIG. 3 relating to this case will be described. During a write operation, when the first column line CL1 goes to "H", the write driver 22 is turned ON, the gate terminal of the third access transistor WA1 goes to "H", and the first bit line BL goes to "L". When the first bit line BL reaches Vdd−Vtn (Vtn: the threshold voltage of the N-channel MOS transistor), the third access transistor WA1 is turned ON, so that the potential of the first memory node D starts decreasing. Further, since the word line WL is activated, the first access transistor MA1 is turned ON, so that the potential of the first memory node D can be easily written. On the other hand, since the first column line CL1 is at "H", the opposite second column line CL2 is at "L", so that the fourth access transistor WA2 remains OFF. Therefore, when the potential of the first memory node D is rewritten from "H" to "L", the third access transistor WA1 as well as the first access transistor MA1 are turned ON, so that data on the first bit line BL can be easily written to the first memory node D without an influence of the "H" potential of the second bit line NBL. Thus, by providing the two access transistors MA1 and WA1, data on the first bit line BL can be easily written to the latch circuit.

(ii) A word line is selected, a bit line is selected, and the same data is written:

It is assumed that data at the first memory node D is "L" and data at the second memory node ND is "H". During a write operation, when the first column line CL1 goes to "H", the write driver 22 is turned ON, the gate terminal of the third access transistor WA1 goes to "H", and the first bit line BL goes to "L". Here, since data on the first bit line BL and data at the first memory node D are the same ("L"), the third access transistor WA1 is OFF. Also, since the first column line CL1 is at "H", the opposite second column line CL2 is at "L", so that the fourth access transistor WA2 is turned OFF. In this case, even if the word line WL is activated, the first and second access transistors MA1 and MA2 are OFF since the first bit line BL and the first memory node D have the same data and the second bit line NBL and the second memory node ND have the same data. Therefore, an erroneous operation does not occur.

(iii) A word line is selected, and a bit line is not selected (i.e., a column is not selected):

It is assumed that data at the first memory node D is "L" and data at the second memory node ND is "H". Since the first and second bit lines BL and NBL are not selected, the first and second bit lines BL and NBL remain at "H". Also, since the first and second column lines CL1 and CL2 are at "L", the third and fourth access transistors WA1 and WA2 are OFF. In this case, even if the word line WL is activated, data at the first memory node D is not rewritten, since an SNM is secured against data "H" on the first bit line BL. Therefore, an erroneous operation does not occur.

(iv) A word line is not selected, a bit line is selected, and inverted data is written:

It is assumed that data at the first memory node D is "H" and data at the second memory node ND is "L". Specifically, when the first memory node D holds the "H" level and the second memory node ND holds the "L" level, "L"-level data is input to the first bit line BL and "H"-level data is input to the second bit line NBL, while the word line WL remains inactivated. This corresponds to a write operation with respect to a non-selected memory cell.

Waveforms shown in FIG. 4 relating to this case will be described. During a write operation, when the first column line CL1 goes to "H", the write driver 22 is turned ON, the gate terminal of the third access transistor WA1 goes to "H", and the first bit line BL goes to "L". When the first bit line BL reaches Vdd-Vtn, the third access transistor WA1 is turned ON, so that the potential of the first memory node D starts decreasing. However, since the word line WL is inactivated, and therefore, the first access transistor MA1 is OFF, the potential of the first memory node D is not lowered to a potential at which the first memory node D is rewritten. On the other hand, since the first column line CL1 is at "H", the opposite second column line CL2 is at "L", so that the fourth access transistor WA2 is turned OFF. Therefore, the potential of the first memory node D falls from "H", but does not reach a potential at which the first memory node D is rewritten, so that the first memory node D holds the "H" potential and the second memory node ND holds the "L" potential without an influence of the "H" potential of the second bit line NBL. Thus, by setting a size such that writing cannot be performed only by the third access transistor WA1, data is not written from the first bit line BL to the latch circuit. Therefore, an erroneous operation does not occur.

(v) A word line is not selected, a bit line is selected, and the same data is written:

It is assumed that data at the first memory node D is "L" and data at the second memory node ND is "H". During a write operation, when the first column line CL1 goes to "H", the write driver 22 is turned ON, the gate terminal of the third access transistor WA1 goes to "H", and the first bit line BL goes to "L". Here, since data on the first bit line BL and data at the first memory node D are the same ("L"), the third access transistor WA1 is OFF. Also, since the first column line CL1 is at "H", the opposite second column line CL2 is at "L", so that the fourth access transistor WA2 is turned OFF. Therefore, an erroneous operation does not occur.

(vi) A word line is not selected, and a bit line is not selected (i.e., a column is not selected):

It is assumed that data at the first memory node D is "L" and data at the second memory node ND is "H". Since the first and second bit lines BL and NBL are not selected, "H" is maintained. Specifically, since the first and second column lines CL1 and CL2 are at "L", the third and fourth access transistors WA1 and WA2 are turned OFF. Therefore, an erroneous operation does not occur.

As described above, during the write operation (i) with respect to a selected memory cell, the contribution of the third access transistor WA1 or the fourth access transistor WA2 facilitates writing to the latch circuit. Under other conditions, an erroneous operation can be prevented in a non-selected column, particularly in the case of a configuration in which a plurality of columns of memory cells are connected to one input/output circuit.

Figure 5:
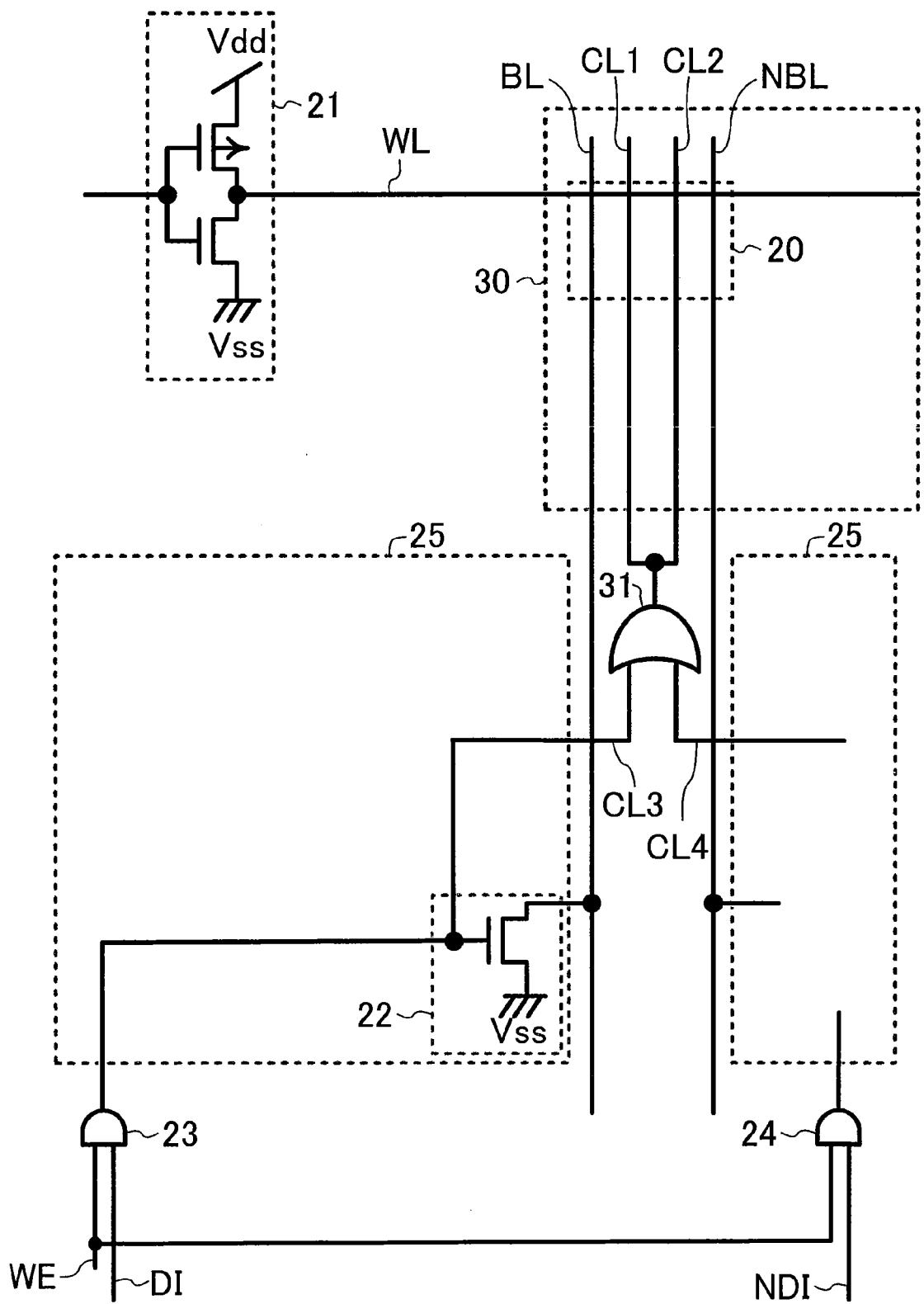
FIG. 5 is a diagram showing a variation of FIG. 2.

FIG. 5 shows a variation of FIG. 2. A two-input OR circuit 31 of FIG. 5 has input terminals connected to nodes of the gate terminals of write drivers 22 via third and fourth column lines CL3 and CL4.

With this configuration, the first and second column lines CL1 and CL2 can be the same line, thereby making it possible to secure wiring resources and reduce the area of a memory cell. Note that the gate terminal of the write driver 22 and the input terminal of the two-input OR circuit 31 may have different nodes as long as they have the same logical value.

Figure 6:
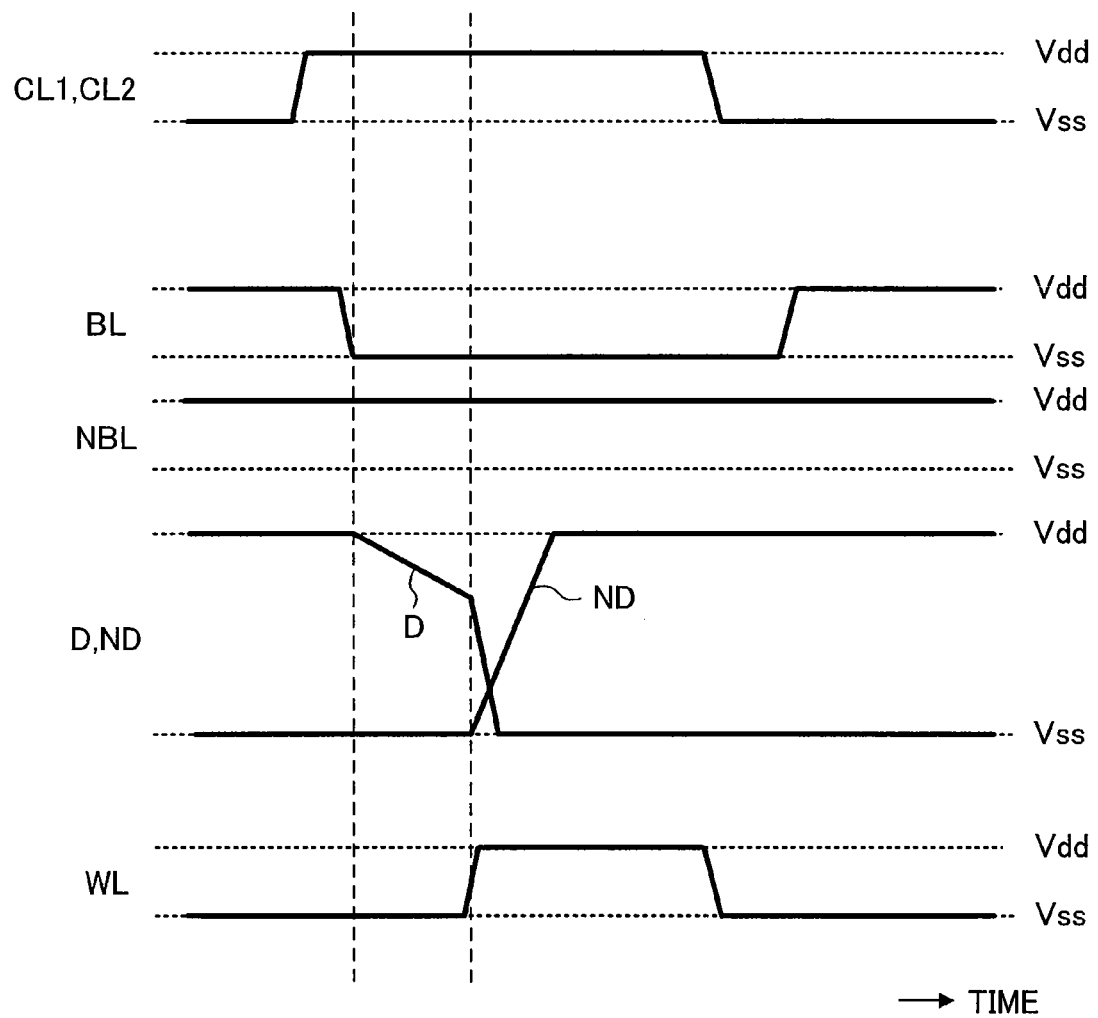
FIG. 6 is a timing diagram of FIG. 5.
Figure 7:
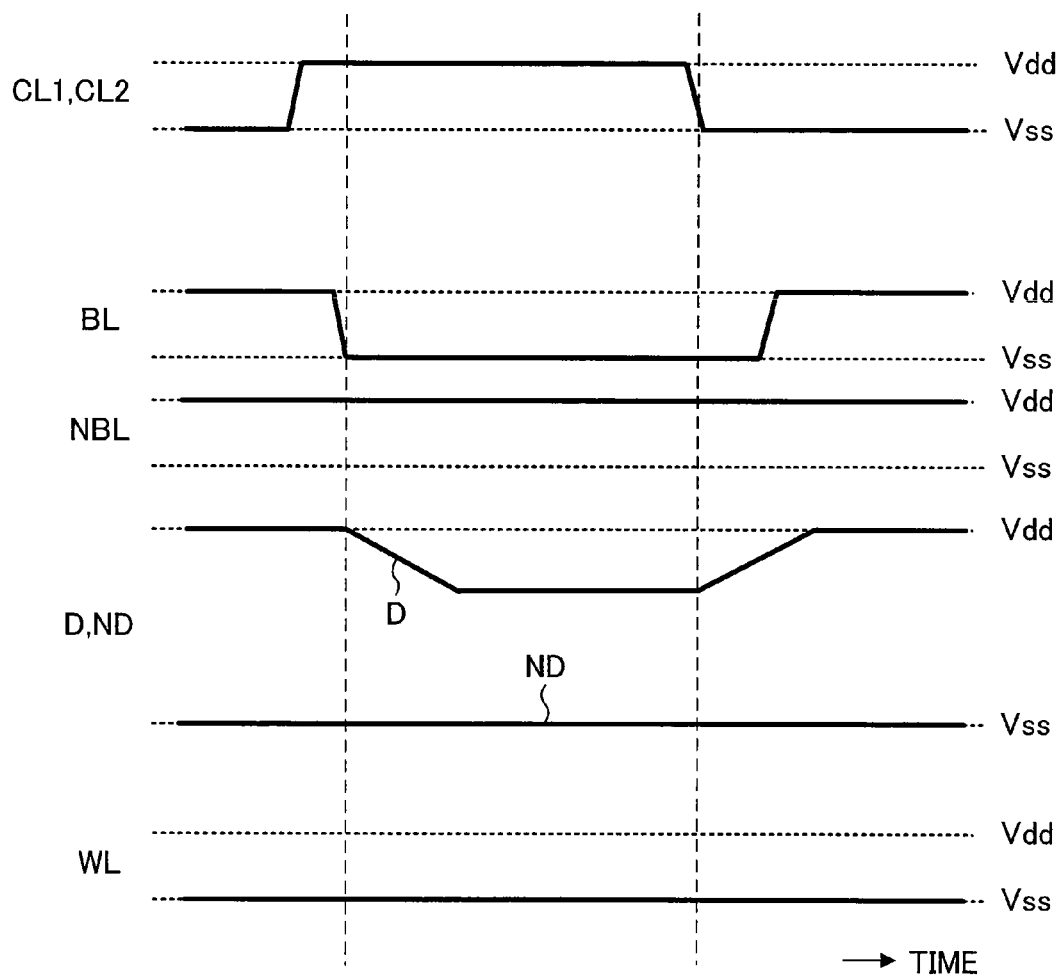
FIG. 7 is another timing diagram of FIG. 5.

FIGS. 6 and 7 are timing diagrams of FIG. 5. Here, also, the following six states will be described:

(i) a word line is selected, a bit line is selected, and inverted data is written <FIG. 6>;

(ii) a word line is selected, a bit line is selected, and the same data is written;

(iii) a word line is selected, and a bit line is not selected (i.e., a column is not selected);

(iv) a word line is not selected, a bit line is selected, and inverted data is written <FIG. 7>;

(v) a word line is not selected, a bit line is selected, and the same data is written; and (vi) a word line is not selected, and a bit line is not selected (i.e., a column is not selected).

(i) A word line is selected, a bit line is selected, and inverted data is written:

Waveforms shown in FIG. 6 will be described. It is assumed that data at the first memory node D is "H" and data at the second memory node ND is "L". During a write operation, when the third column line CL3 goes to "H", the write driver 22 is turned ON, so that the first bit line BL goes to "L". Also, via the two-input OR circuit 31, the gate terminals of the third and fourth access transistors WA1 and WA2 go to "H". When the first bit line BL reaches Vdd-Vtn, the third access transistor WA1 is turned ON, so that the potential of the first memory node D starts decreasing. Further, the word line WL is activated, so that the first access transistor MA1 is turned ON, and as a result, the potential of the first memory node D can be easily rewritten. On the other hand, since the third column line CL3 is at "H", the opposite fourth column line CL4 is at "L" and the second bit line NBL remains at "H". Since data at the second memory node ND is "L", the fourth access transistor WA2 to whose gate terminal "H" is applied is turned ON. Therefore, when the potential of the first memory node D is rewritten from "H" to "L", not only the first and second access transistors MA1 and MA2 but also the third and fourth access transistors WA1 and WA2 are turned ON, so that data on the first and second bit lines BL and NBL can be easily written to the first and second memory nodes D and ND.

(ii) A word line is selected, a bit line is selected, and the same data is written:

It is assumed that data at the first memory node D is "L" and data at the second memory node ND is "H". During a write operation, when the third column line CL3 goes to "H", the write driver 22 is turned ON, so that the first bit line BL goes to "L". Also, via the two-input OR circuit 31, the gate terminals of the third and fourth access transistors WA1 and WA2 go to "H". Here, since data on the first bit line BL and data at the first memory node D are the same ("L") and data on the second bit line NBL and data at the first memory node D are the same ("H"), the third and fourth access transistors WA1 and WA2 are OFF. In this case, even if the word line WL is activated, the first and second access transistors MA1 and MA2 are OFF since data on the first bit line BL and data at the first memory node D are the same and data on the second bit line NBL and data at the first memory node D are the same. Therefore, an erroneous operation does not occur.

(iii) A word line is selected, and a bit line is not selected (i.e., a column is not selected):

It is assumed that data at the first memory node D is "L" and data at the second memory node ND is "H". Since the first and second bit lines BL and NBL are not selected, "H" is maintained. Specifically, since the first and second column lines CL1 and CL2 are at "L", the third and fourth access transistors WA1 and WA2 are OFF. In this case, even if the word line WL is activated, data at the first memory node D is not rewritten, since an SNM is secured against data "H" on the first bit line BL. Therefore, an erroneous operation does not occur.

(iv) A word line is not selected, a bit line is selected, and inverted data is written:

Waveforms shown in FIG. 7 will be described. It is assumed that data at the first memory node D is "H" and data at the second memory node ND is "L". During a write operation, when the third column line CL3 goes to "H", the write driver 22 is turned ON, so that the first bit line BL goes to "L". Also, via the two-input OR circuit 31, the gate terminals of the third and fourth access transistors WA1 and WA2 go to "H". When the first bit line BL reaches Vdd-Vtn, the third access transistor WA1 is turned ON, so that the potential of the first memory node D starts decreasing. However, since the word line WL is inactivated, and therefore, the first and second access transistors MA1 and MA2 are OFF, the potentials of the first and second memory nodes D and ND are not changed to a potential at which the first and second memory nodes D and ND are rewritten. Therefore, the potential of the first memory node D falls from "H", but does not reach the potential at which the first memory node D is rewritten, so that the potential remains on the "H" side. Therefore, an erroneous operation does not occur.

(v) A word line is not selected, a bit line is selected, and the same data is written:

It is assumed that data at the first memory node D is "L" and data at the second memory node ND is "H". During a write operation, when the third column line CL3 goes to "H", the write driver 22 is turned ON, so that the first bit line BL goes to "L". Also, via the two-input OR circuit 31, the gate terminals of the third and fourth access transistors WA1 and WA2 go to "H". Here, since data on the first bit line BL and data at the first memory node D are the same ("L") and data on the second bit line NBL and data at the second memory node ND are the same ("H"), the third and fourth access transistors WA1 and WA2 are OFF. In this case, even if the word line WL is activated, the first and second access transistors MA1 and MA2 are OFF since data on the first bit line BL and data at the first memory node D are the same and data on the second bit line NBL and data at the second memory node ND are the same. Therefore, an erroneous operation does not occur.

(vi) A word line is not selected, and a bit line is not selected (i.e., a column is not selected):

It is assumed that data at the first memory node D is "L" and data at the second memory node ND is "H". Since the first and second bit lines BL and NBL are not selected, "H" is maintained. Specifically, since the first and second column lines CL1 and CL2 are at "L", the third and fourth access transistors WA1 and WA2 are OFF. In this case, even if the word line WL is activated, data at the first memory node D is not rewritten, since an SNM is secured against data "H" on the first bit line BL. Therefore, an erroneous operation does not occur.

Thus, in the write operation (i) with respect to a selected memory cell, the contribution of the third access transistor WA1 or the fourth access transistor WA2 facilitates writing to the latch circuit. Under other conditions, an erroneous operation can be prevented in a non-selected column, particularly in the case of a configuration in which a plurality of columns of memory cells are connected to one input/output circuit.

Figure 8:
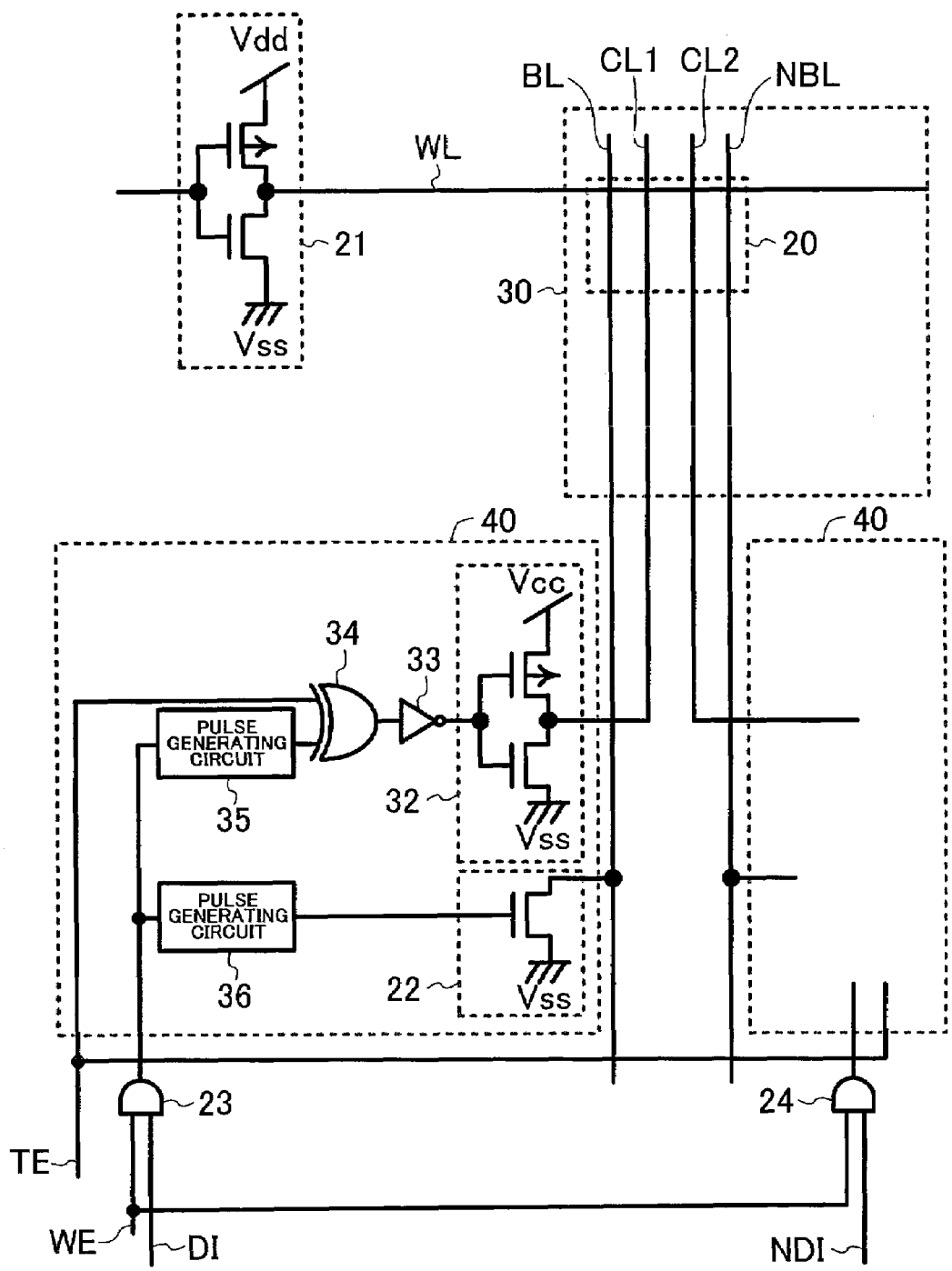
FIG. 8 is a diagram showing a second schematic exemplary configuration involved with a data write operation of an SRAM including the memory cell of FIG. 1.

FIG. 8 shows a second schematic exemplary configuration involved with a data write operation of an SRAM including the memory cell 20 of FIG. 1. In FIG. 8, 32 indicates a column line driver, and 40 indicates a write circuit. The column line driver 32 is a first inverter circuit having a third potential Vcc at a power supply voltage, and drives the first column line CL1. The third potential Vcc is higher than the first potential Vdd. A second inverter circuit 33 drives the column line driver 32. A two-input EXOR circuit 34 has two inputs, where one input receives a test enable signal TE and the other input receives an output of a first pulse generating circuit 35, and drives the second inverter circuit 33. The first pulse generating circuit 35 receives an output of the first two-input AND circuit 23 and drives the two-input EXOR circuit 34. The pulse width of a pulse signal generated by the first pulse generating circuit 35 can be adjusted, depending on a delay time in a delay circuit comprised of, for example, logic gates connected in series. A second pulse generating circuit 36 receives the output of the first two-input AND circuit 23 and drives the write driver 22. The pulse width of a pulse signal generated by the second pulse generating circuit 36 can be adjusted, depending on a delay time in a delay circuit comprised of, for example, logic gates connected in series. Also, gate lengths of the third and fourth access transistors WA1 and WA2 are lengths in the row direction of their gate terminals and are larger than or equal to gate lengths of the first and second access transistors MA1 and MA2. Gate widths of the third and fourth access transistors WA1 and WA2 are lengths in the column direction of their gate terminals and are smaller than or equal to gate widths of the first and second access transistors MA1 and MA2. A gate width of the N-channel MOS transistor included in the write driver 22 is larger than a value obtained by multiplying a gate width of the first load transistor ML1 by a quotient obtained by dividing the number of memory cells in the row direction by two.

In this configuration, potentials applied to the third and fourth access transistors WA1 and WA2 are set to be the third potential Vcc that is higher than the first potential Vdd applied to the word line WL. Therefore, the drive capability of the third and fourth access transistors WA1 and WA2 can be improved, resulting in a further improvement in write operation margin. As another advantage, by the improvement of the drive capability, a similar effect can be obtained, i.e., the areas of the third and fourth access transistors WA1 and WA2 can be reduced, resulting in a smaller area of the memory cell 20.

Further, in this configuration, the gate lengths of the third and fourth access transistors WA1 and WA2 are larger than or equal to the gate lengths of the first and second access transistors MA1 and MA2. Therefore, the current drive capability of the third and fourth access transistors WA1 and WA2 is lower than the current drive capability of the first and second access transistors MA1 and MA2. Therefore, in the case of (iv) (a word line is not selected, a bit line is selected, and inverted data is written), data in the memory cell 20 is not destroyed by a deterioration in SNM. Similarly, the gate widths of the third and fourth access transistors WA1 and WA2 are smaller than or equal to the gate widths of the first and second access transistors MA1 and MA2. Therefore, the current drive capability of the third and fourth access transistors WA1 and WA2 is lower than the current drive capability of the first and second access transistors MA1 and MA2. Therefore, in the case of (iv) (a word line is not selected, a bit line is selected, and inverted data is written), data in the memory cell 20 is not destroyed by a deterioration in SNM.

Further, in this configuration, the gate width of the N-channel MOS transistor included in the write driver 22 is larger than a value obtained by multiplying the gate width of the first load transistor ML1 by a quotient obtained by dividing the number of memory cells in the row direction by two. Therefore, even if all memory cells in the row direction on the first bit line BL driven by the N-channel MOS transistor are at "H", the drive capability of the N-channel MOS transistor is greater than the drive capability of load transistors the number of which is equal to the number of all memory cells in the row direction. Therefore, the bit line BL goes to "L", so that writing to the memory cell 20 can be normally performed. Note that the division by two is performed since, when an N-channel MOS transistor and a P-channel MOS transistor have the same gate width and the same gate length, the current drive capability of the N-channel MOS transistor is generally two times greater than the current drive capability of the P-channel MOS transistor.

Figure 9:
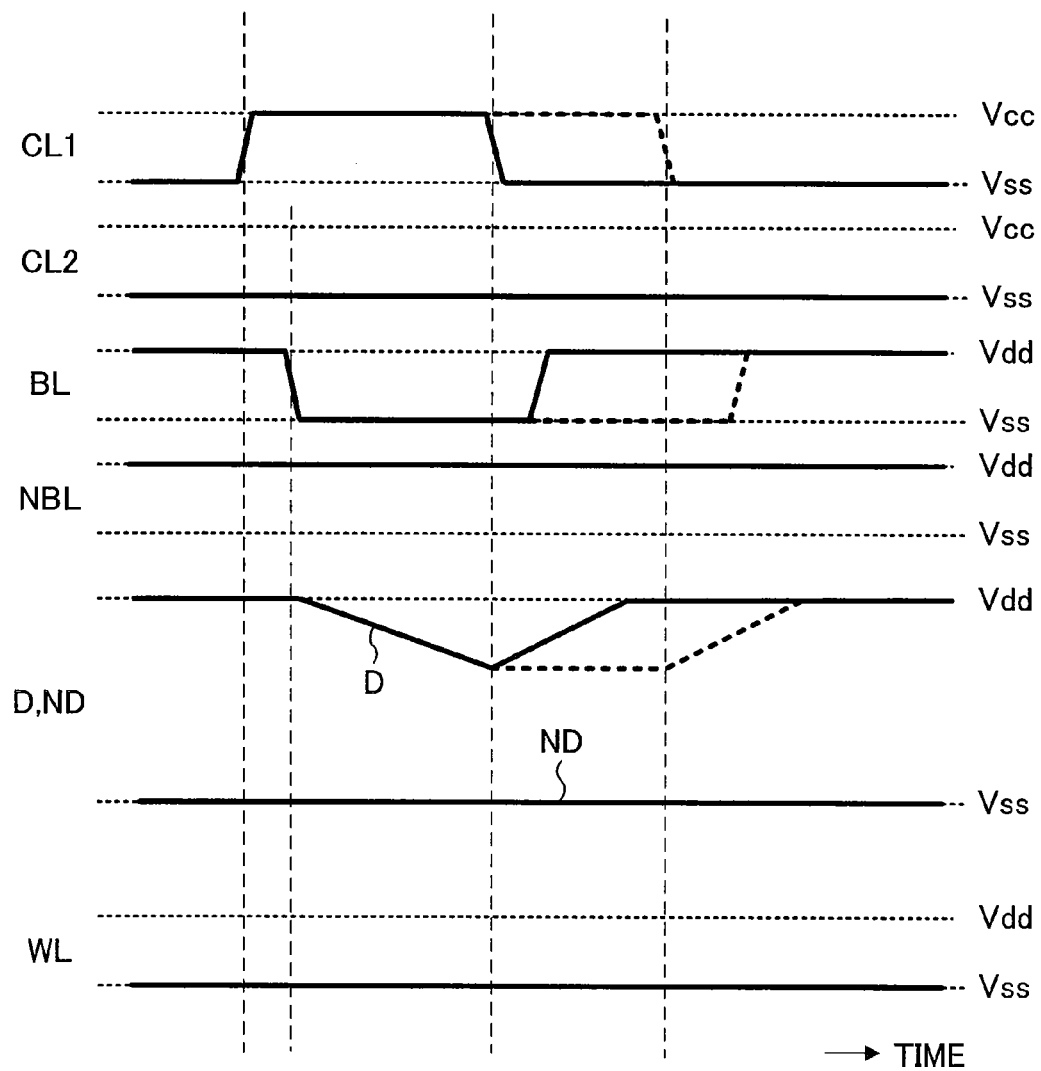
FIG. 9 is a timing diagram of FIG. 8.

Further, in this configuration, as shown in FIG. 9, when a word line is not selected, a bit line is selected, and inverted data is written, the gate terminals of the third and fourth access transistors WA1 and WA2 are controlled using a pulse signal, so that a write erroneous operation can be prevented. Also, a period of time in which the write driver 22 is ON and the first bit line BL is at "L" and a period of time in which the first column line CL1 is ON are shortened, so that power consumption can be reduced.

Figure 10:
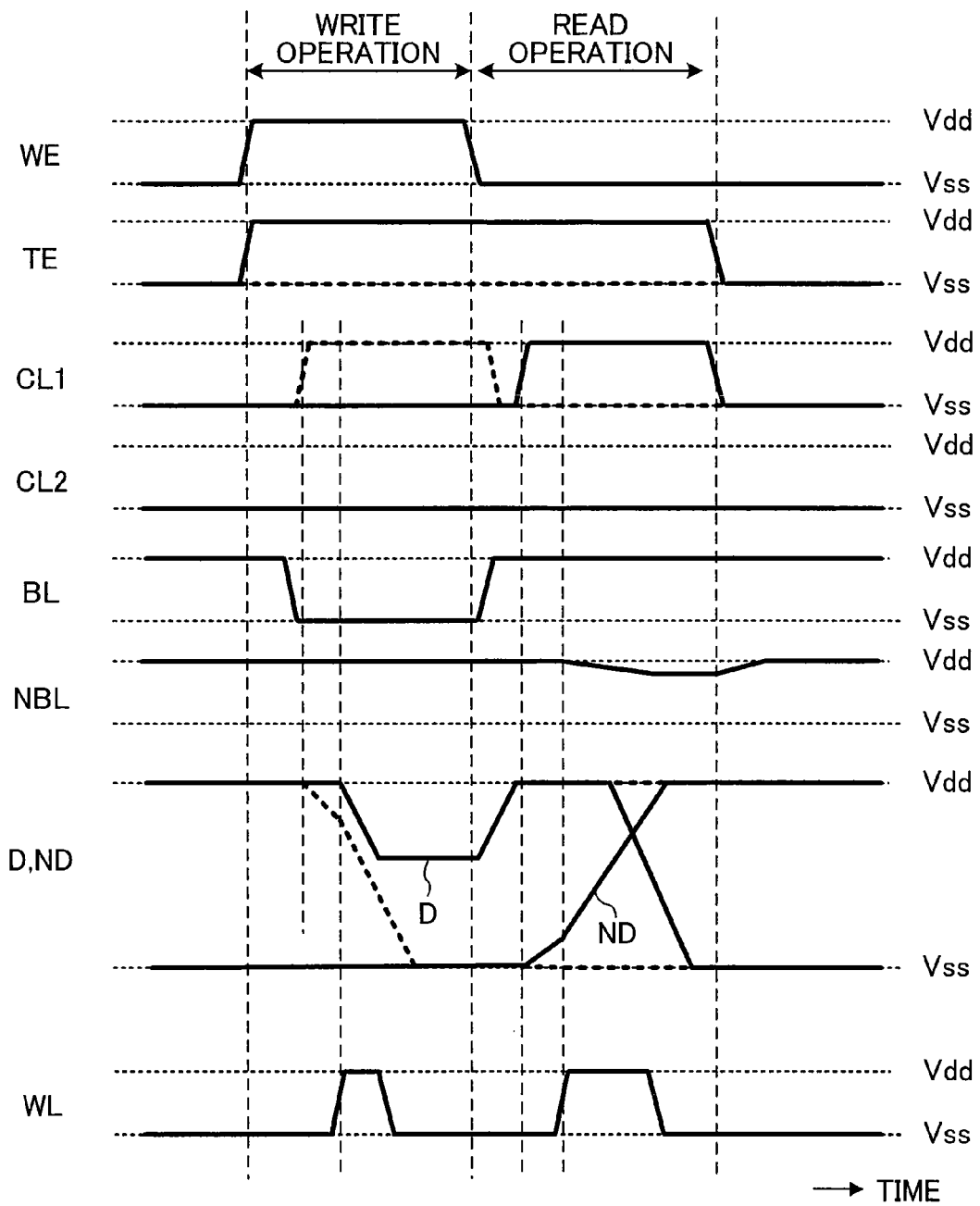
FIG. 10 is another timing diagram of FIG. 8.

Further, in this configuration, as shown in FIG. 10, if the write enable signal WE is activated (i.e., a write operation), then when the test enable signal TE is inactivated, the first column line CL1 goes to "H", so that the third access transistor WA1 is turned ON, and therefore, the memory cell 20 can be easily written (dashed line). However, when the test enable signal TE is activated, the first column line CL1 goes to "L", so that the third access transistor WA1 is turned OFF, and therefore, writing cannot be performed in some SRAMs (solid line). Therefore, the test enable signal TE can be used to determine whether or not a write operation can be easily performed. In other words, it is possible to determine whether or not an SRAM is defective, highly reliable or the like.

Also, if the write enable signal WE is inactivated (i.e., a read operation), then when the test enable signal TE is inactivated, the first column line CL1 goes to "L", so that the third access transistor WA1 is turned OFF, and therefore, the memory cell 20 can be normally read out (dashed line). However, when the test enable signal TE is activated, the first column line CL1 goes to "H". When the first bit line BL reaches a voltage lower than Vdd−Vtn by a read operation of the memory cell 20, the third access transistor WA1 is turned ON. In other words, both the first access transistor MA1 and the third access transistor WA1 are turned ON, resulting in a deterioration in SNM. If the memory cell array 30 has large variations, the first and second memory nodes D and ND in the memory cell 20 may be reversed, i.e., an erroneous operation (solid line). Therefore, the test enable signal TE can be used to determine whether or not a read operation can be normally performed. In other words, it is possible to determine whether or not an SRAM is defective, highly reliable or the like.

Figure 11:
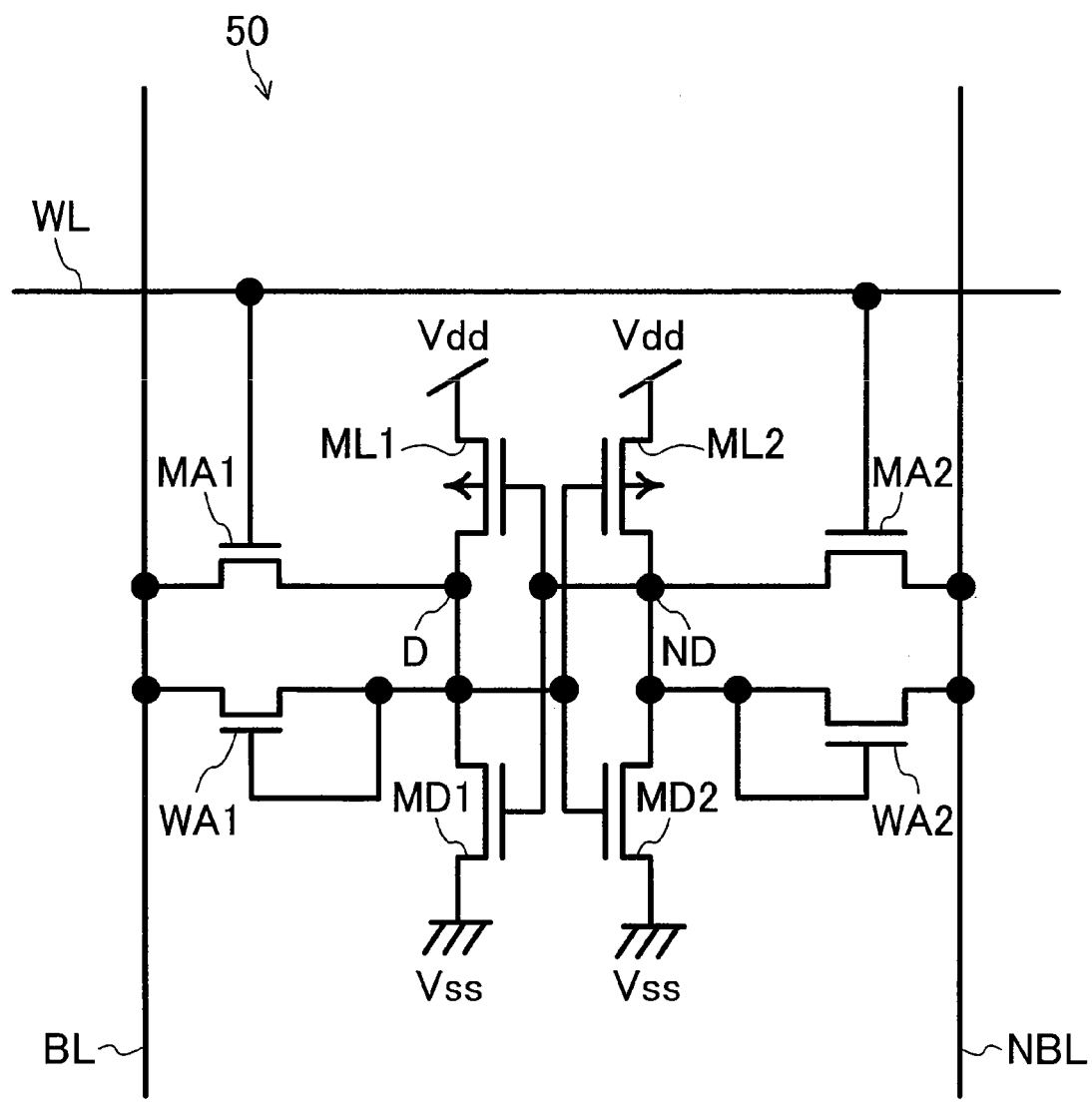
FIG. 11 is a diagram showing a second exemplary configuration of a memory cell in an SRAM that is a semiconductor memory device according to an embodiment of the present invention.

FIG. 11 shows a second exemplary configuration of a memory cell in an SRAM that is a semiconductor memory device according to an embodiment of the present invention. The memory cell 50 of FIG. 11 is a memory cell for storing complement data at first and second memory nodes D and ND, and comprises first and second load transistors ML1 and ML2, first and second drive transistors MD1 and MD2, first and second access transistors MA1 and MA2, and third and fourth access transistors (write assisting transistors) WA1 and WA2.

Specifically, the first load transistor ML1 is a P-channel MOS transistor that has a drain terminal connected to the first memory node D, a source terminal to which a power supply voltage Vdd is supplied, and a gate terminal connected to the second memory node ND. The second load transistor ML2 is a P-channel MOS transistor that has a drain terminal connected to the second memory node ND, a source terminal to which the power supply voltage Vdd is supplied, and a gate terminal connected to the first memory node D. The first drive transistor MD1 is an N-channel MOS transistor that has a drain terminal connected to the first memory node D, a source terminal connected to a ground voltage Vss, and a gate terminal connected to the second memory node ND. The second drive transistor MD2 is an N-channel MOS transistor that has a drain terminal connected to the second memory node ND, a source terminal connected to the ground voltage Vss, and a gate terminal connected to the first memory node D. The first access transistor MA1, which is an N-channel MOS transistor, is provided between the first memory node D and a first bit line BL, and the second access transistor MA2, which is an N-channel MOS transistor, is provided between the second memory node ND and a second bit line NBL. The first and second access transistors MA1 and MA2 each have a gate terminal connected to a word line WL.

The third access transistor WA1 is provided between the first bit line BL and the first memory node D, and has a gate terminal connected to the first memory node D. The fourth access transistor WA2 is provided between the second bit line NBL and the second memory node ND, and has a gate terminal connected to the second memory node ND.

With this configuration, the use of an external signal is not required for a control of the gate terminals of the third and fourth access transistors WA1 and WA2, thereby making it possible to secure wiring resources, reduce the area of a memory cell, and the like, in addition to an improvement in write operation margin.

Figure 12:
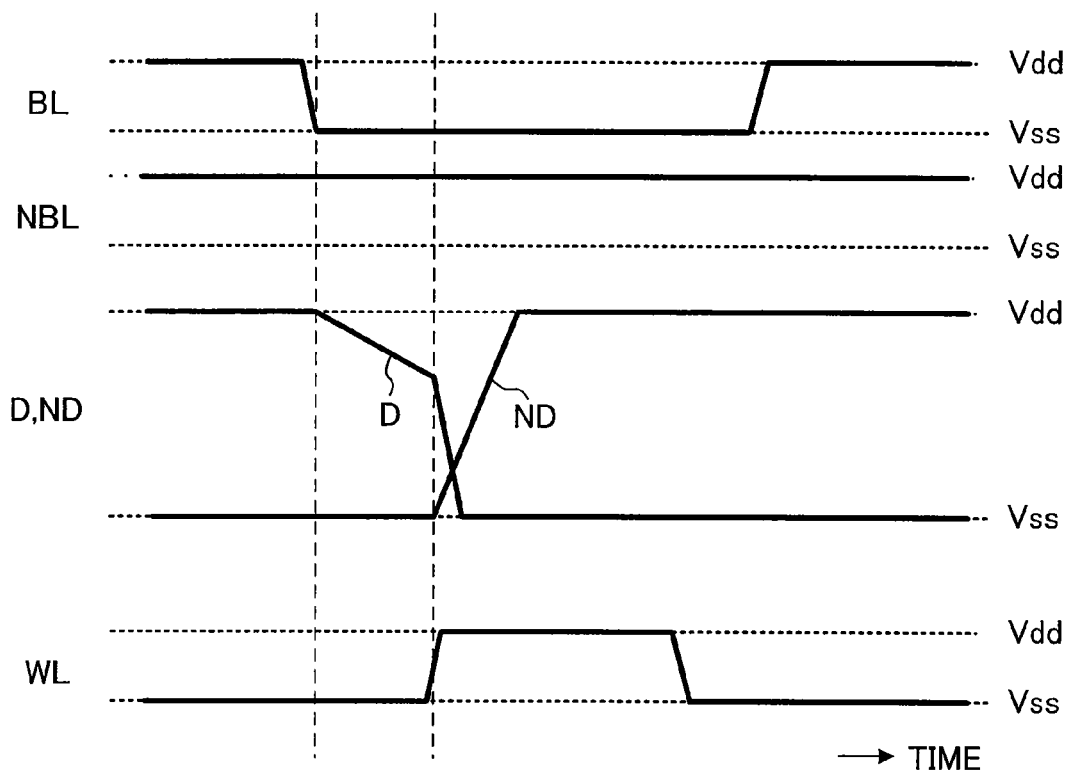
FIG. 12 is a timing diagram of FIG. 11.
Figure 13:
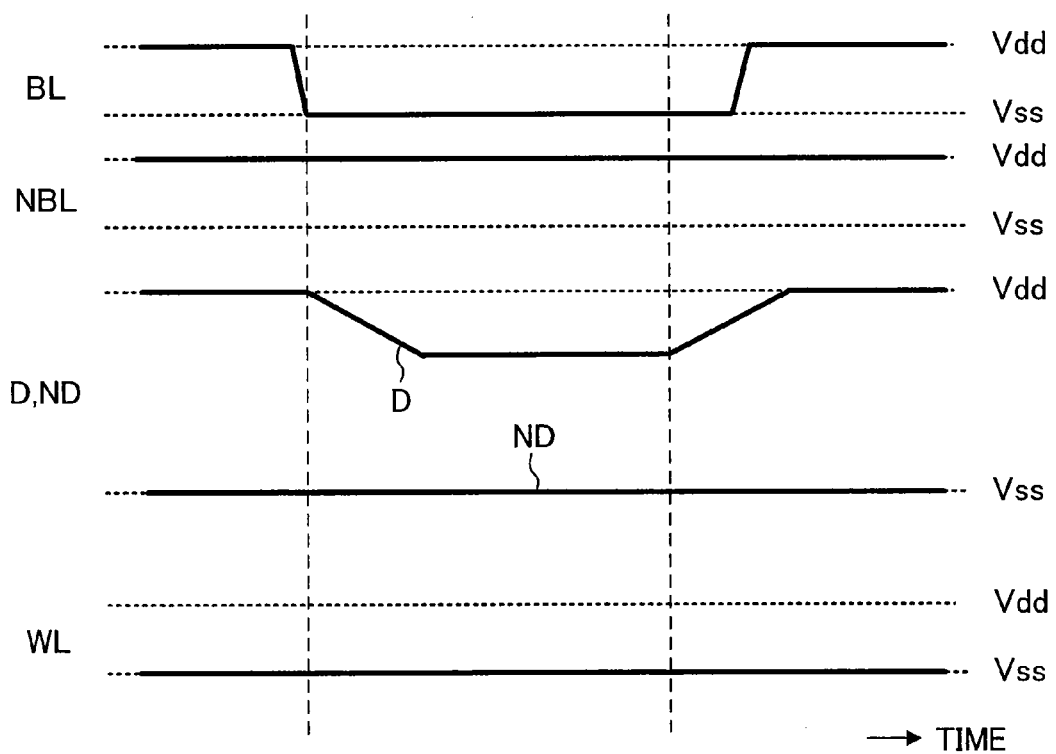
FIG. 13 is another timing diagram of FIG. 11.

FIGS. 12 and 13 are timing diagrams of FIG. 11. Here, also, the following six states will be described:

(i) a word line is selected, a bit line is selected, and inverted data is written <FIG. 12>;

(ii) a word line is selected, a bit line is selected, and the same data is written;

(iii) a word line is selected, and a bit line is not selected (i.e., a column is not selected);

(iv) a word line is not selected, a bit line is selected, and inverted data is written <FIG. 13>;

(v) a word line is not selected, a bit line is selected, and the same data is written; and (vi) a word line is not selected, and a bit line is not selected (i.e., a column is not selected).

(i) A word line is selected, a bit line is selected, and inverted data is written:

Waveforms shown in FIG. 12 will be described. It is assumed that data at the first memory node D is "H" and data at the second memory node ND is "L". Specifically, the gate terminal of the third access transistor WA1 is at "H", and the gate terminal of the fourth access transistor WA2 is at "L", i.e., is OFF. During a write operation, when the first bit line BL reaches Vdd-Vtn, the third access transistor WA1 is turned ON, so that the potential of the first memory node D starts decreasing. Further, since the word line WL is activated, the first access transistor MA1 is turned ON, so that the potential of the first memory node D can be easily rewritten. Therefore, when the potential of the first memory node D is rewritten from "H" to "L", not only the first access transistor MA1 but also the third access transistor WA1 are turned ON, so that data on the first bit line BL can be easily written to the first memory node D.

(ii) A word line is selected, a bit line is selected, and the same data is written:

It is assumed that data at the first memory node D is "L" and data at the second memory node ND is "H". Therefore, the gate terminal of the third access transistor WA1 is at "L", i.e., is OFF. The gate terminal of the fourth access transistor WA2 is at "H". During a write operation, since data on the first bit line BL is "L", data on the second bit line NBL is "H", which is the same as data at the second memory node ND. Therefore, the fourth access transistor WA2 is turned OFF. In this case, even if the word line WL is activated, the first and second access transistors MA1 and MA2 are OFF since data on the first bit line BL and data at the first memory node D are the same and data on the second bit line NBL and data at the second memory node ND are the same. Therefore, an erroneous operation does not occur.

(iii) A word line is selected, and a bit line is not selected (i.e., a column is not selected):

It is assumed that data at the first memory node D is "L" and data at the second memory node ND is "H". Therefore, the gate terminal of the third access transistor WA1 is at "L", i.e., is OFF. The gate terminal of the fourth access transistor WA2 is at "H". Also, since the first and second bit lines BL and NBL are not selected, "H" is maintained. Since data on the second bit line NBL and data at the second memory node ND are the same, the fourth access transistor WA2 is turned OFF. In this case, even if the word line WL is activated, data at the first memory node D is not rewritten, since an SNM is secured against data "H" on the first bit line BL. Therefore, an erroneous operation does not occur.

(iv) A word line is not selected, a bit line is selected, and inverted data is written:

Waveforms shown in FIG. 13 will be described. It is assumed that data at the first memory node D is "H" and data at the second memory node ND is "L". Therefore, the gate terminal of the third access transistor WA1 goes to "H", and the gate terminal of the fourth access transistor WA2 goes to "L". During a write operation, when the first bit line BL reaches Vdd-Vtn, the third access transistor WA1 is turned ON, so that the potential of the first memory node D starts decreasing. However, since the word line WL is inactivated, and therefore, the first access transistor MA1 is OFF, the potential of the first memory node D does not fall to a potential at which the first memory node D is rewritten. Therefore, the potential of the first memory node D falls from "H", but does not reach the potential at which the first memory node D is rewritten, so that the potential remains the "H" side. Therefore, an erroneous operation does not occur.

(v) A word line is not selected, a bit line is selected, and the same data is written:

It is assumed that data at the first memory node D is "L" and data at the second memory node ND is "H". Therefore, the gate terminal of the third access transistor WA1 is at "L", i.e., is OFF. The gate terminal of the fourth access transistor WA2 is at "H". During a write operation, since data on the second bit line NBL and data at the second memory node ND are the same ("H"), the fourth access transistor WA2 is OFF. Therefore, an erroneous operation does not occur.

(vi) A word line is not selected, and a bit line is not selected (i.e., a column is not selected):

It is assumed that data at the first memory node D is "L" and data at the second memory node ND is "H". Therefore, the gate terminal of the third access transistor WA1 is at "L", i.e., is OFF. The gate terminal of the fourth access transistor WA2 is at "H". Since data on the second bit line NBL and data at the second memory node ND are the same ("H"), the fourth access transistor WA2 is OFF. Therefore, an erroneous operation does not occur.

As described above, during the write operation (i) with respect to a selected memory cell, the contribution of the third access transistor WA1 or the fourth access transistor WA2 facilitates writing to the latch circuit. Under other conditions, an erroneous operation can be prevented in a non-selected column, particularly in the case of a configuration in which a plurality of columns of memory cells are connected to one input/output circuit.

Figure 14:
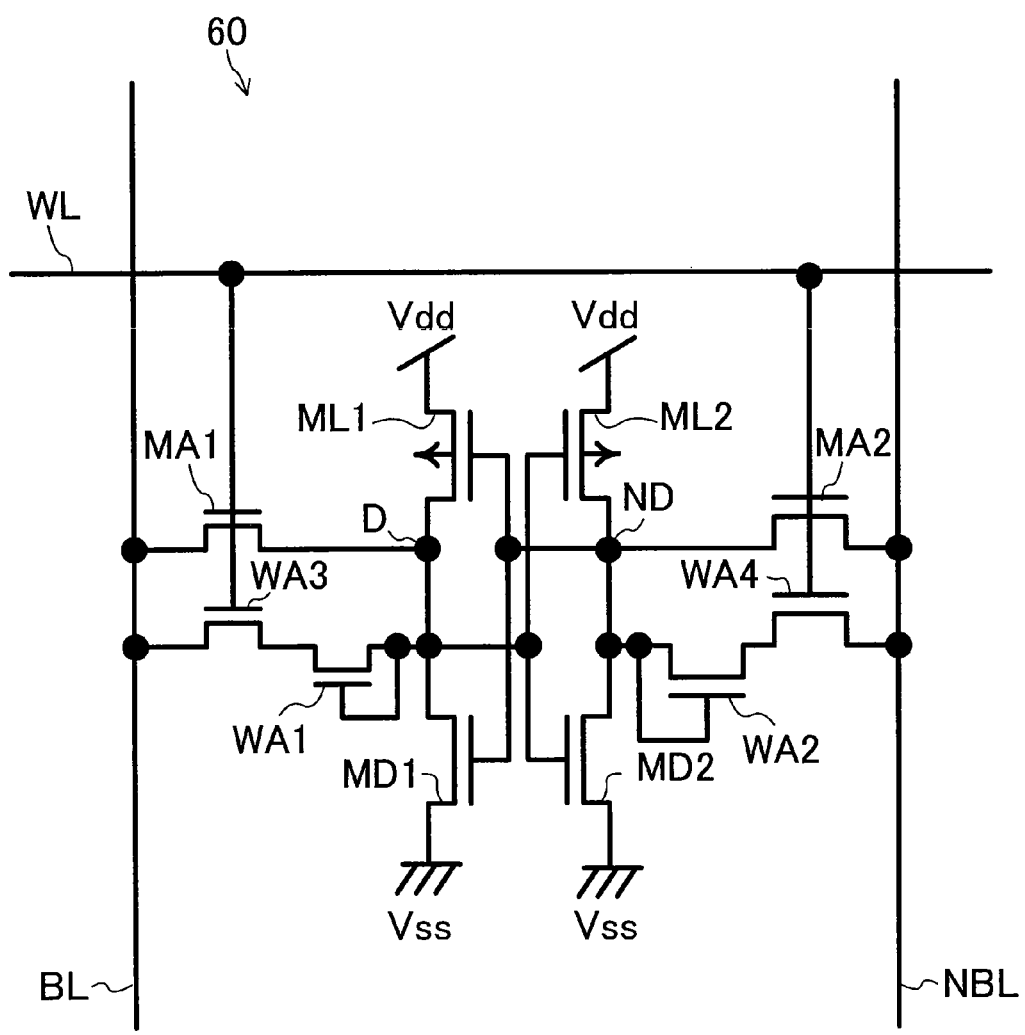
FIG. 14 is a diagram showing a variation of FIG. 11.

FIG. 14 shows, as a variation of FIG. 11, a memory cell 60 in which fifth and sixth access transistors WA3 and WA4 are additionally provided. The fifth and sixth access transistors WA3 and WA4 of FIG. 14 are connected to the word line WL and are provided between the first and second bit lines BL and NBL and the first and second memory nodes D and ND, respectively.

Figure 15:
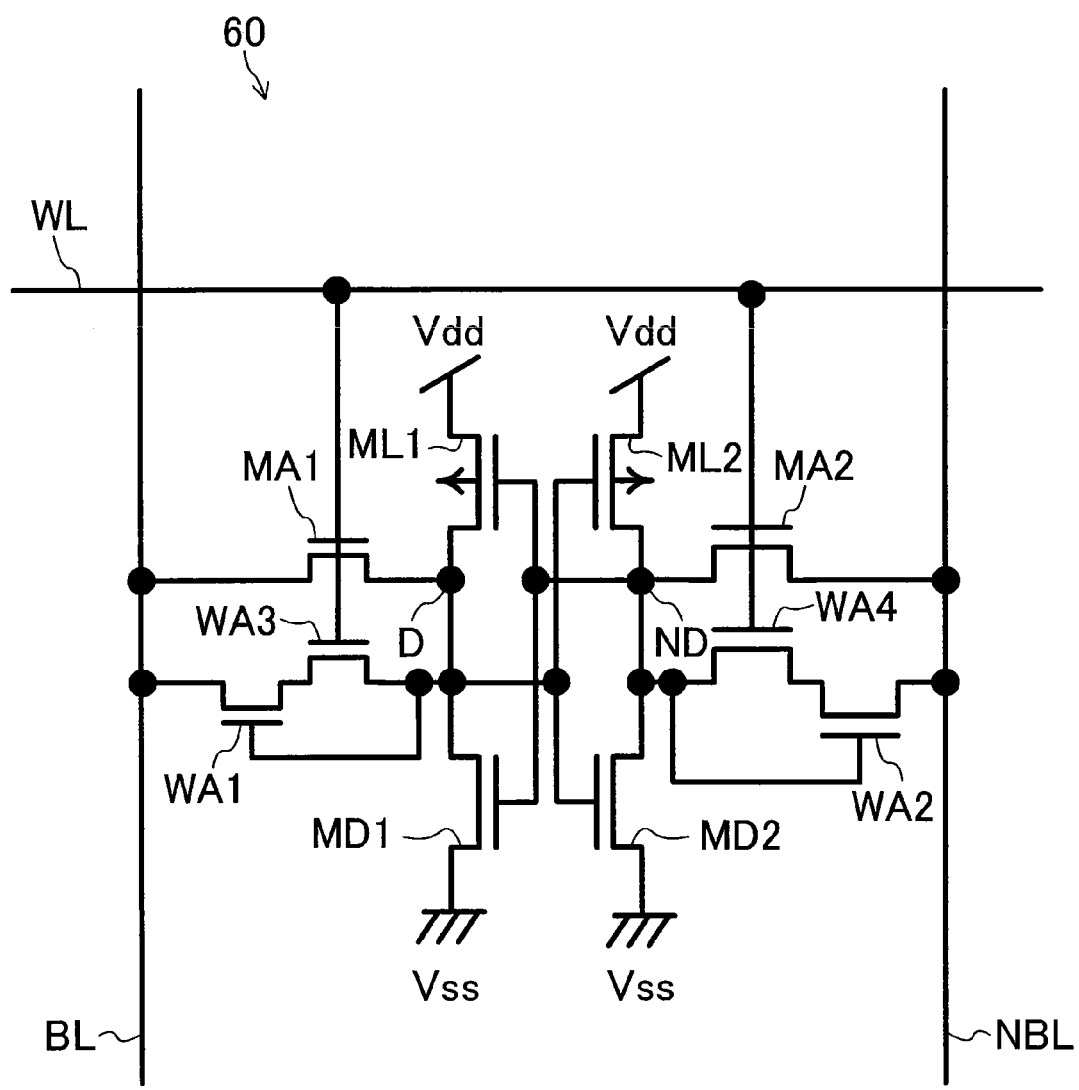
FIG. 15 is a diagram showing a variation of FIG. 14.

FIG. 15 shows a variation of FIG. 14 in which the relationship in connection between the third and fourth access transistors WA1 and WA2 and the fifth and sixth access transistors WA3 and WA4 is reversed.

With the configurations of FIGS. 14 and 15, since the word line WL is inactivated under the condition (iv) (a word line is not selected, a bit line is selected, and inverted data is written), current paths between the first and second bit lines BL and NBL and the first and second memory nodes D and ND are interrupted. In other words, the fifth and sixth access transistors WA3 and WA4 are OFF. Therefore, under the condition (iv), a current flowing through the first bit line BL can be reduced, resulting in a reduction in power consumption.

Figure 16:
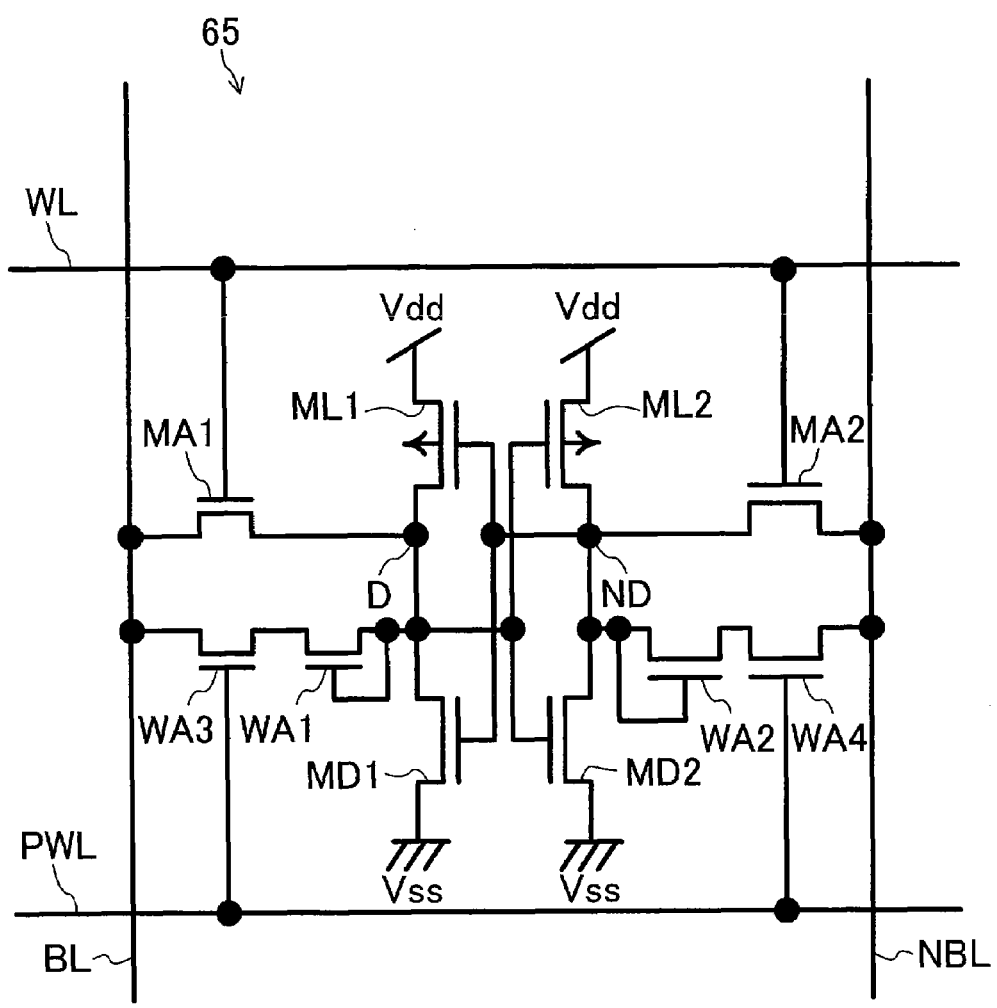
FIG. 16 is a diagram showing another variation of FIG. 14.

FIG. 16 shows a variation of FIG. 14. 65 indicates a memory cell, and PWL indicates a second word line. The second word line PWL is connected to gate terminals of the fifth and sixth access transistors WA3 and WA4.

Figure 17:
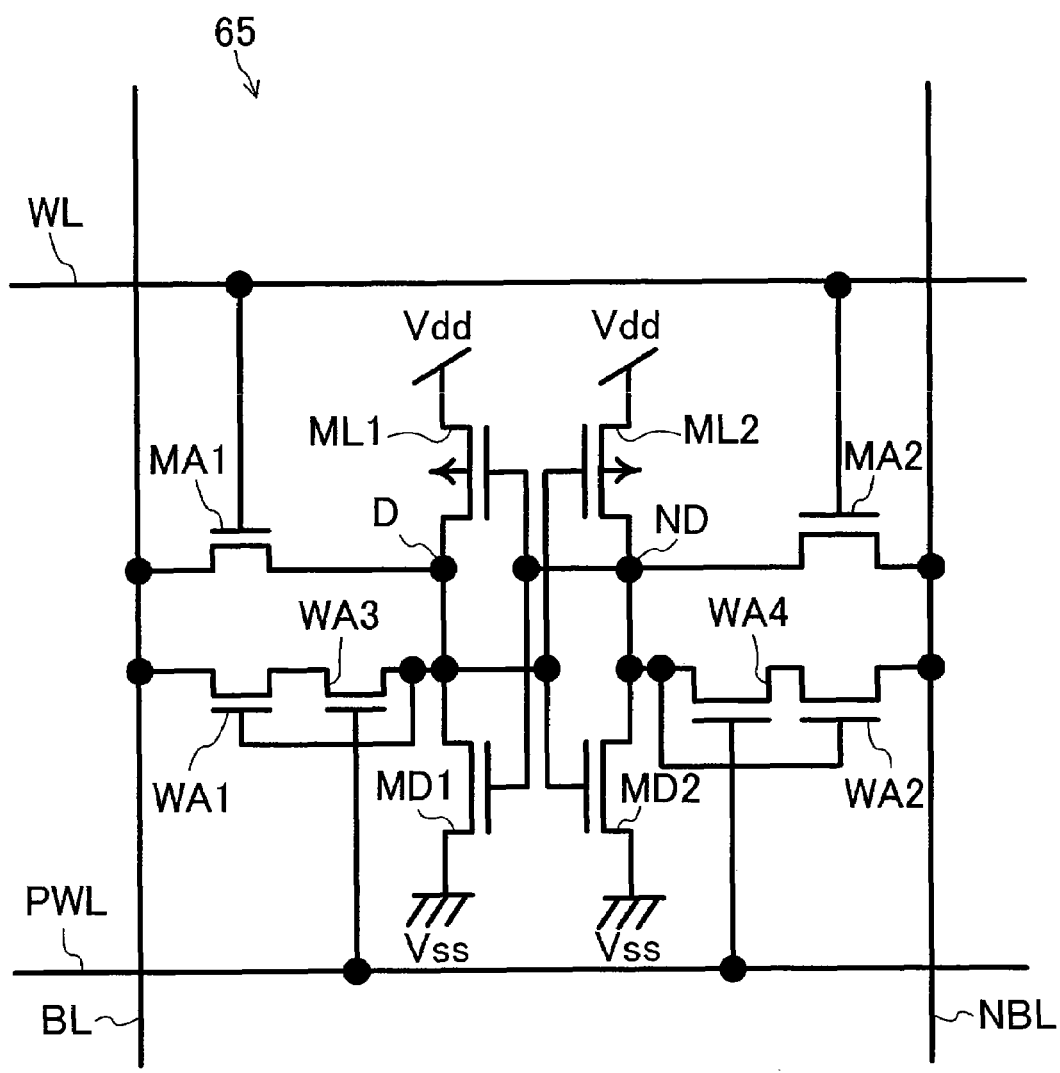
FIG. 17 is a diagram showing a variation of FIG. 16.

FIG. 17 shows a variation of FIG. 16 in which the relationship in connection between the third and fourth access transistors WA1 and WA2 and the fifth and sixth access transistors WA3 and WA4 is reversed.

Figure 18:
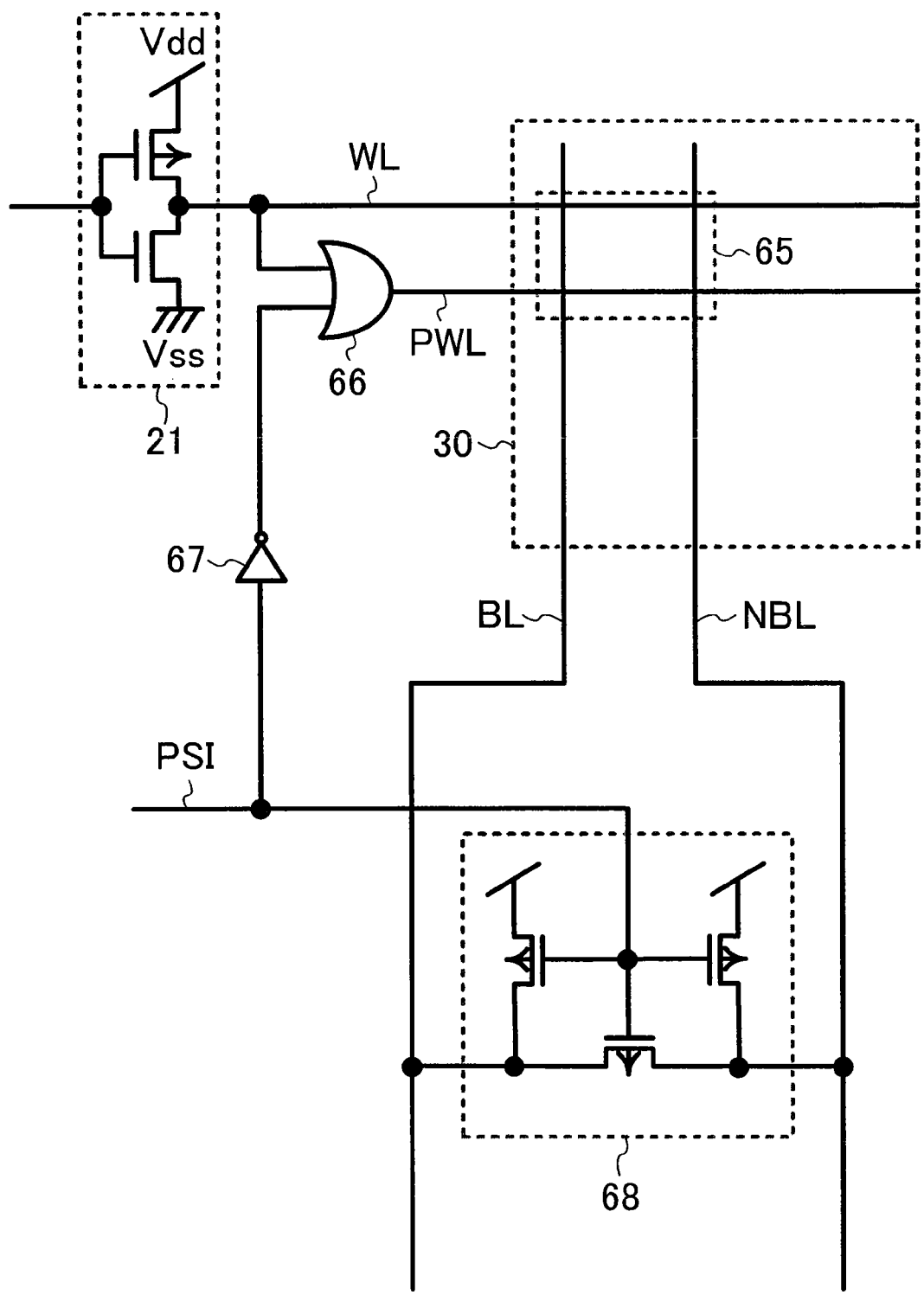
FIG. 18 is a diagram showing a schematic exemplary configuration involved with a data write operation of an SRAM including a memory cell of FIG. 16.

FIG. 18 shows a second schematic exemplary configuration involved with a data write operation of an SRAM including the memory cell 65 of FIG. 16. In FIG. 18, 66 indicates a two-input OR circuit, 67 indicates an inverter circuit, 68 indicates an equalizer/precharger circuit, and PSI indicates a precharge control signal. The two-input OR circuit 66 has two inputs, where one input receives the first word line WL and the other input receives an output signal of the inverter circuit 67, and drives the second word line PWL. The inverter circuit 67 drives the two-input OR circuit 66. The equalizer/precharger circuit 68 is provided between the first and second bit lines BL and NBL. The precharge control signal PSI is input to the equalizer/precharger circuit 68 and an input terminal of the inverter circuit 67.

Figure 19:
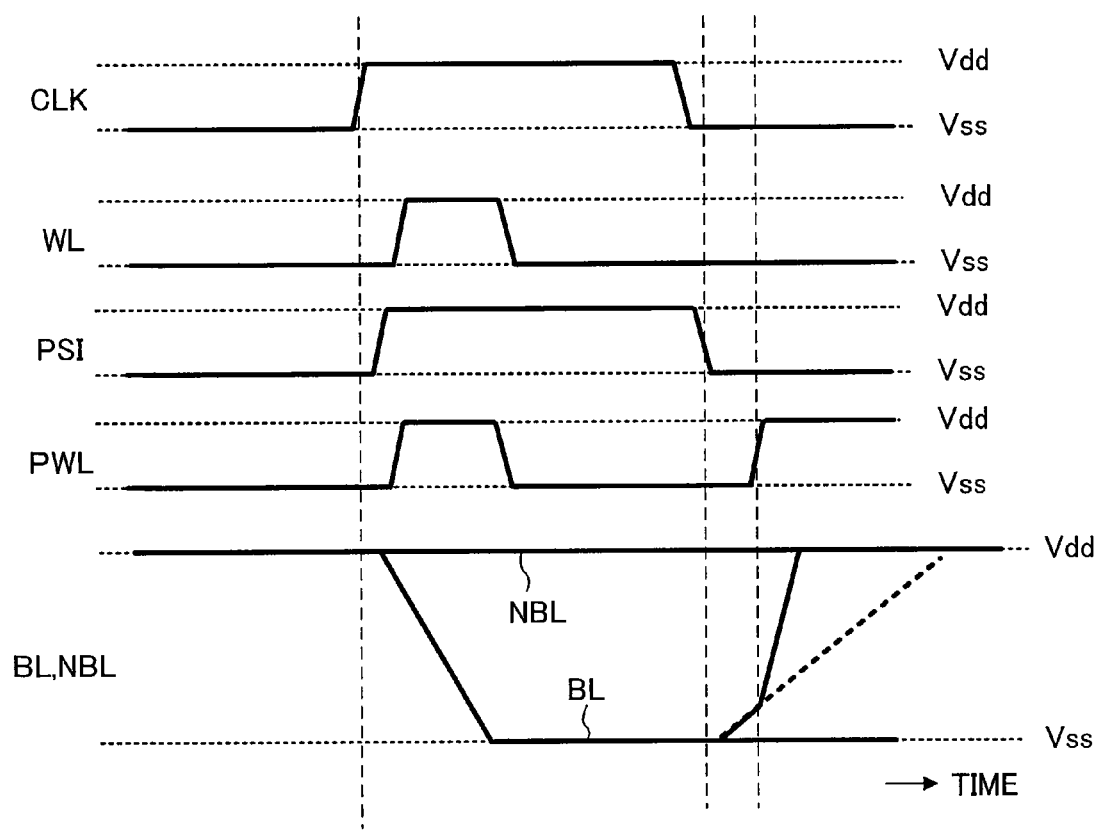
FIG. 19 is a timing diagram of FIG. 18.

In this configuration, as shown in FIG. 19, when the first and second bit lines BL and NBL are precharged, the second word line PWL is turned ON so that the first or second load transistor ML1 or ML2 of the memory cell 65 can be used for precharging. Therefore, the speed of precharging can be increased and the frequency of clock cycles can be increased.

Figure 20:
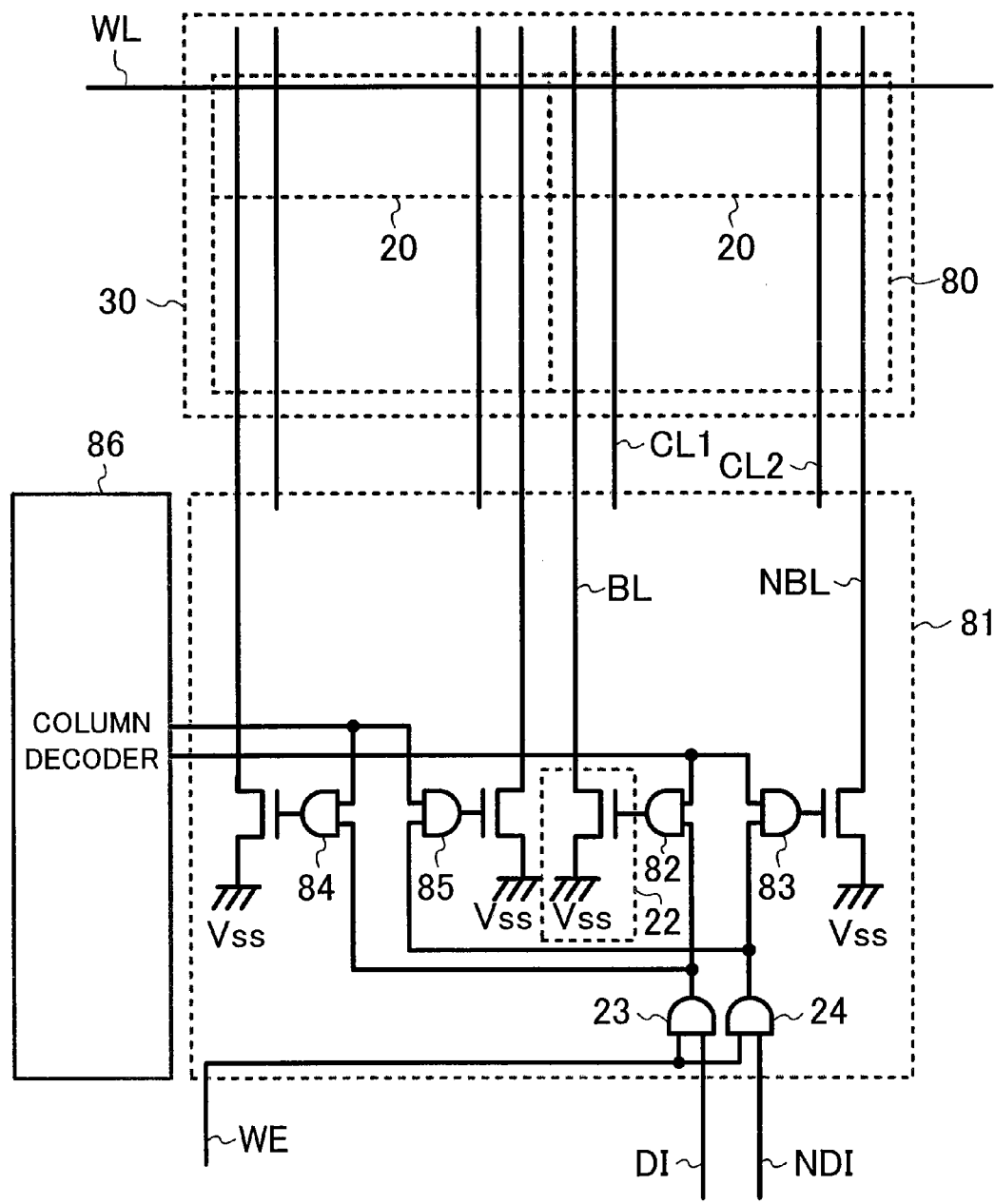
FIG. 20 is a diagram showing an exemplary configuration of an SRAM that is a semiconductor memory device according to an embodiment of the present invention.

FIG. 20 shows an exemplary configuration of an SRAM that is a semiconductor memory device according to an embodiment of the present invention. In FIG. 20, 80 indicates a column array of memory cells, 81 indicates a write circuit, 82 to 85 each indicate a two-input AND circuit, and 86 indicates a column decoder. The memory cell column array 80 has an array structure in which memory cells are arranged in the column direction. One write circuit 81 is connected to a plurality of memory cell column arrays 80.

The two-input AND circuit 82 receives outputs of the column decoder 86 and the two-input AND circuit 23, and drives the write driver 22. The other two-input AND circuits 83 to 85 have a similar structure. Note that, in FIG. 20, only the write circuit 81 is shown and a read circuit is not shown. As is similar to the write circuit 81, a plurality of columns of memory cells may be connected to one read circuit.

With this configuration, the area of the write circuit 81 is reduced with respect to the memory cell array in the column, resulting in a reduction in area.

Figure 21:
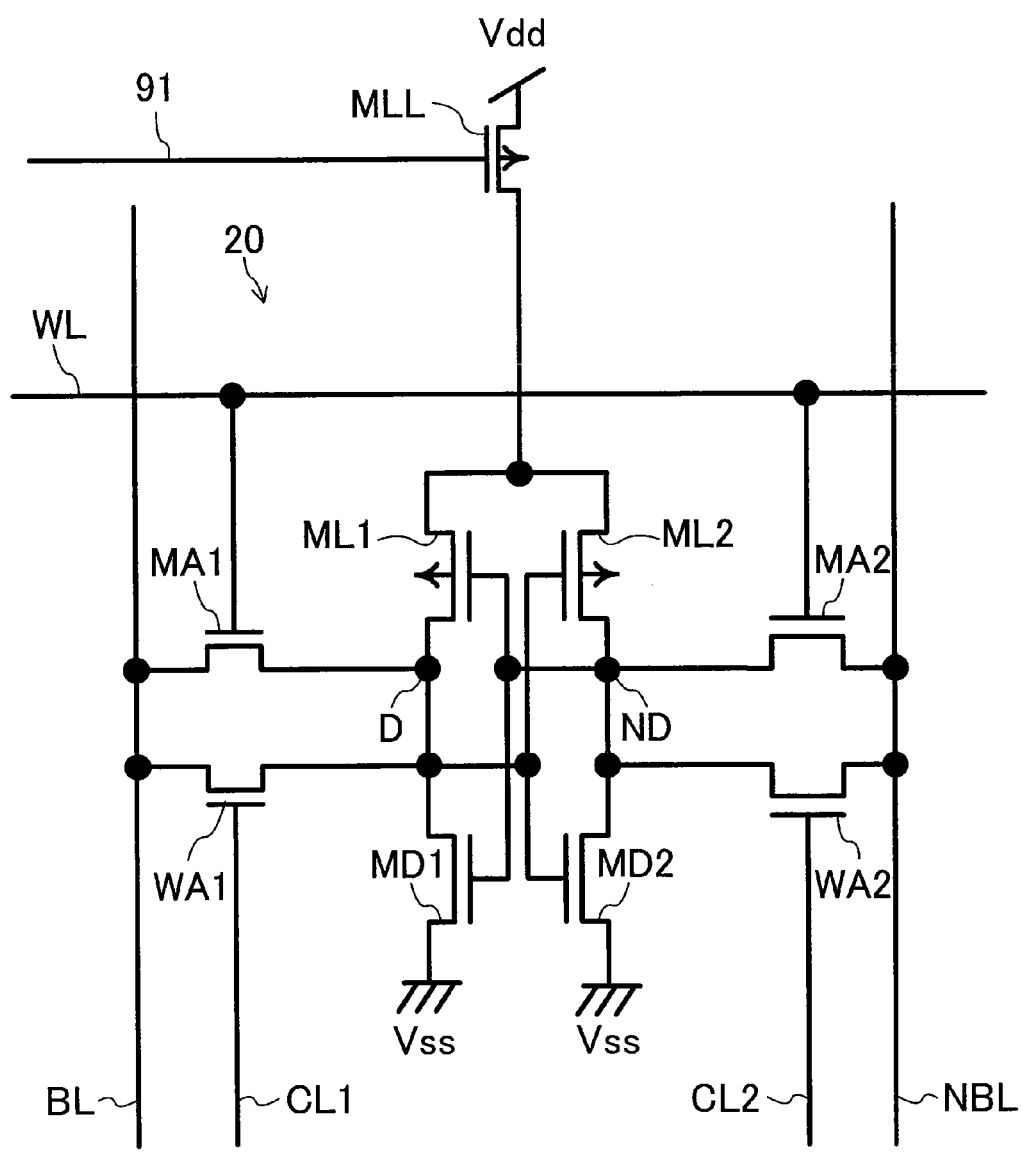
FIG. 21 is a diagram showing a third exemplary configuration of a memory cell in an SRAM that is a semiconductor memory device according to an embodiment of the present invention.

FIG. 21 shows a third exemplary configuration of a memory cell in an SRAM that is a semiconductor memory device according to an embodiment of the present invention.

The memory cell 20 of FIG. 21 has a configuration similar to that of FIG. 1, except for the source terminals of the first and second load transistors ML1 and ML2. In FIG. 21, MLL indicates a P-channel MOS transistor, and 91 indicates a node that is input to a gate terminal of the P-channel MOS transistor MLL. The P-channel MOS transistor MLL has a source terminal that receives a power supply voltage Vdd, a drain terminal that is connected to the source terminals of the first and second load transistors ML1 and ML2, and the gate terminal, to which the node 91 is connected.

In this configuration, the source terminals of the first and second load transistors ML1 and ML2 are connected via the P-channel MOS transistor MLL to the power supply voltage Vdd, so that they are sensitive to variations in power supply. Therefore, when data at the first and second memory node D and ND are rewritten during a write operation, the resistance of the P-channel MOS transistor MLL causes the source potentials of the first and second load transistors ML1 and ML2 to be lower than the power supply voltage Vdd, so that the write operation is facilitated.

Figure 22:
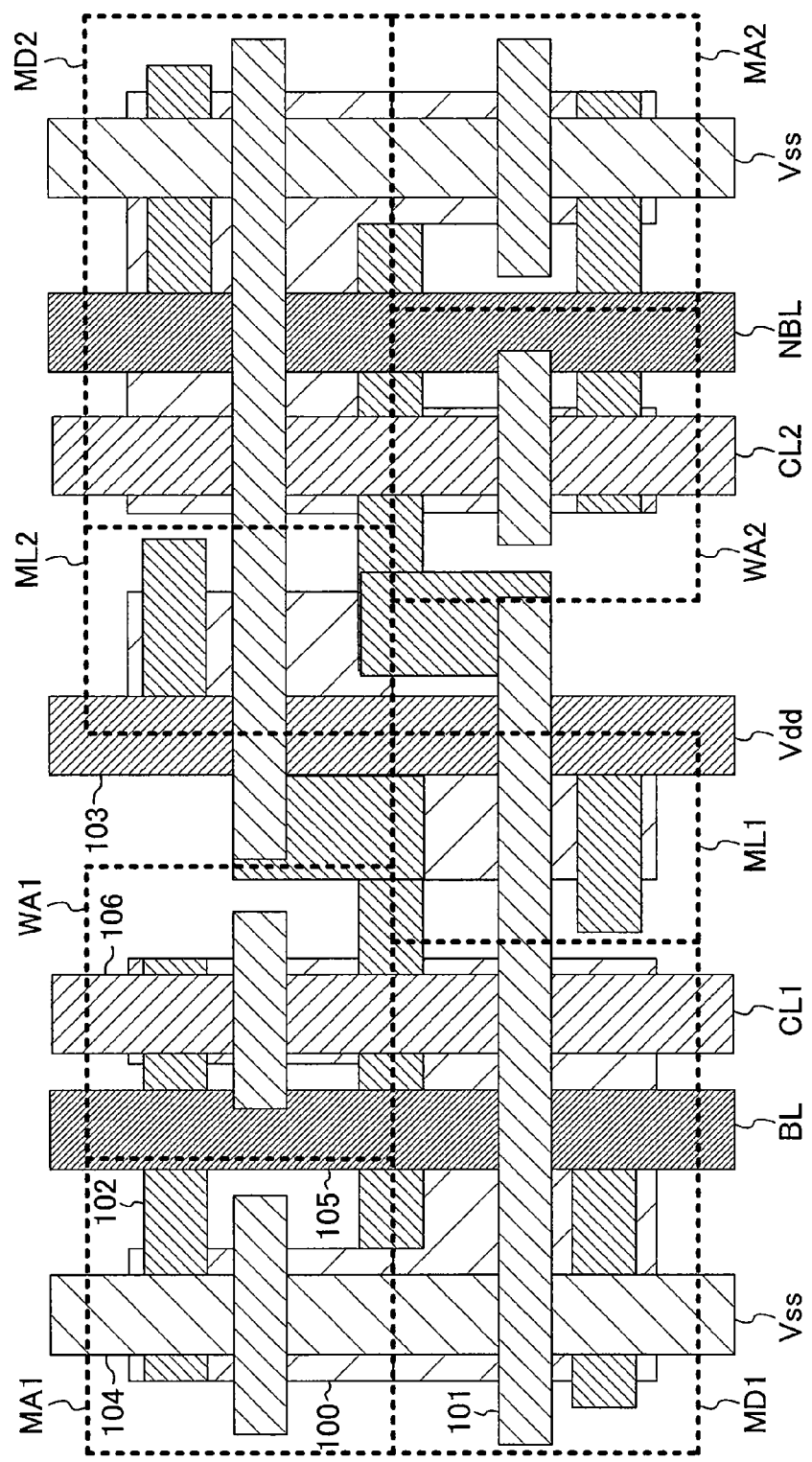
FIG. 22 is a plan view showing a first schematic exemplary configuration (layout) of the memory cell of FIG. 1.

FIG. 22 shows a first schematic exemplary configuration (layout) of the memory cell 20 of FIG. 1. In FIG. 22, 100 indicates a diffusion layer, 101 indicates a gate electrode, 102 indicates a first wiring layer, 103 indicates a second wiring layer, 104 indicates a third wiring layer, 105 indicates a fourth wiring layer, and 106 indicates a fifth wiring layer.

In this configuration, a wire for supplying the first potential Vdd is provided between the first column line CL1 and the second column line CL2. The wire for supplying the first potential Vdd serves as an absorber that absorbs noise during signal transmission on the first and second column lines CL1 and CL2, so that the signal voltage noise between the column lines can be reduced.

Further, in this configuration, the gate terminals of the third and fourth access transistors WA1 and WA2 extend in substantially a straight line in the column direction of the memory cell, so that manufacturing variations can be reduced at the same time.

Further, in this configuration, the first column line CL1 and the first bit line BL are provided in different wiring layers, and the first column line CL1 is provided in the higher wiring layer than that of the first bit line BL. Therefore, during a read operation, a signal is not changed on the first column line CL1, so that the first column line CL1 serves a shield for the first bit line BL. Therefore, noise from an upper layer can be reduced.

Figure 23:
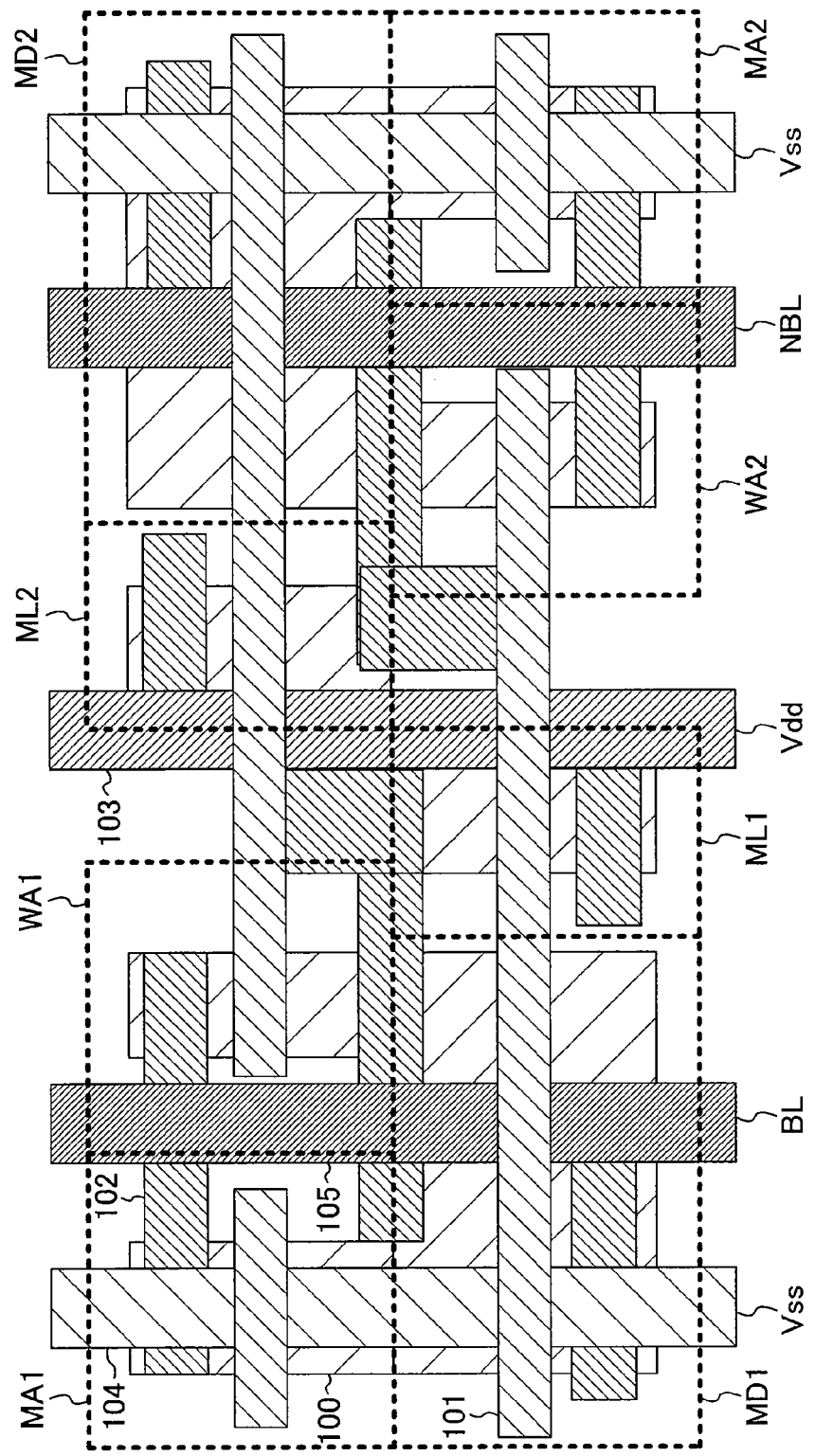
FIG. 23 is a plan view showing a first schematic exemplary configuration (layout) of the memory cell of FIG. 11.

FIG. 23 shows a first schematic exemplary configuration (layout) of the memory cell 50 of FIG. 11. FIG. 23 is different from FIG. 22 in that the gate terminal of the third access transistor WA1 is connected to the gate terminal of the second load transistor ML2, and the gate terminal of the fourth access transistor WA2 is connected to the gate terminal of the first load transistor ML1.

In this configuration, the gate terminal of the third access transistor WA1 extends in substantially a straight line in the column direction of the memory cell, and is connected to the gate terminal of the second load transistor ML2, so that a reduction in area and a reduction in manufacturing variations can be simultaneously achieved.

Further, in this configuration, the gate terminal of the third access transistor WA1 extends in substantially a straight line in the column direction of the memory cell, and is connected to the diffusion layer of the first load transistor ML1, so that each connecting wire does not need to bypass, resulting in a memory cell having a small area.

Further, in this configuration, a pitch width between the gate terminal of the first drive transistor MD1 and the gate terminal of the first access transistor MA1 is substantially equal to a pitch width between the gate terminal of the first access transistor MA1 and the gate terminal of the third access transistor WA1 in the row direction of the memory cell. Thus, the gates are equally spaced in the memory cell row direction, so that manufacturing variations can be suppressed.

Further, in this configuration, a length in the row direction of one of a plurality of memory cells is two times as large as an interval in the memory cell row direction between a middle of the gate length of the third access transistor WA1 and a middle of the gate length of the first drive transistor MD1, resulting in a reduction in bit line length and a reduction in area.

Figure 24:
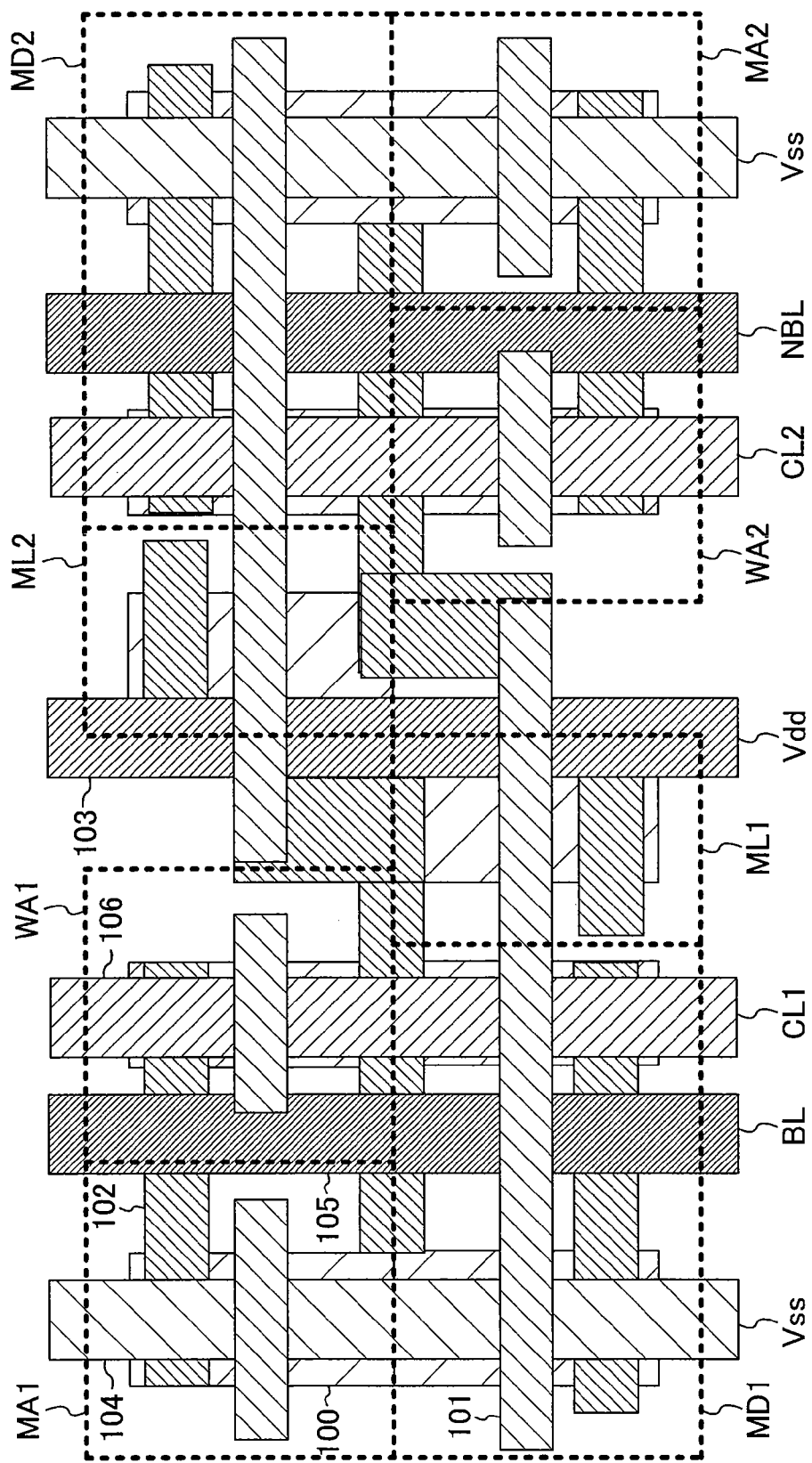
FIG. 24 is a plan view showing a second schematic exemplary configuration (layout) of the memory cell of FIG. 1.
Figure 25:
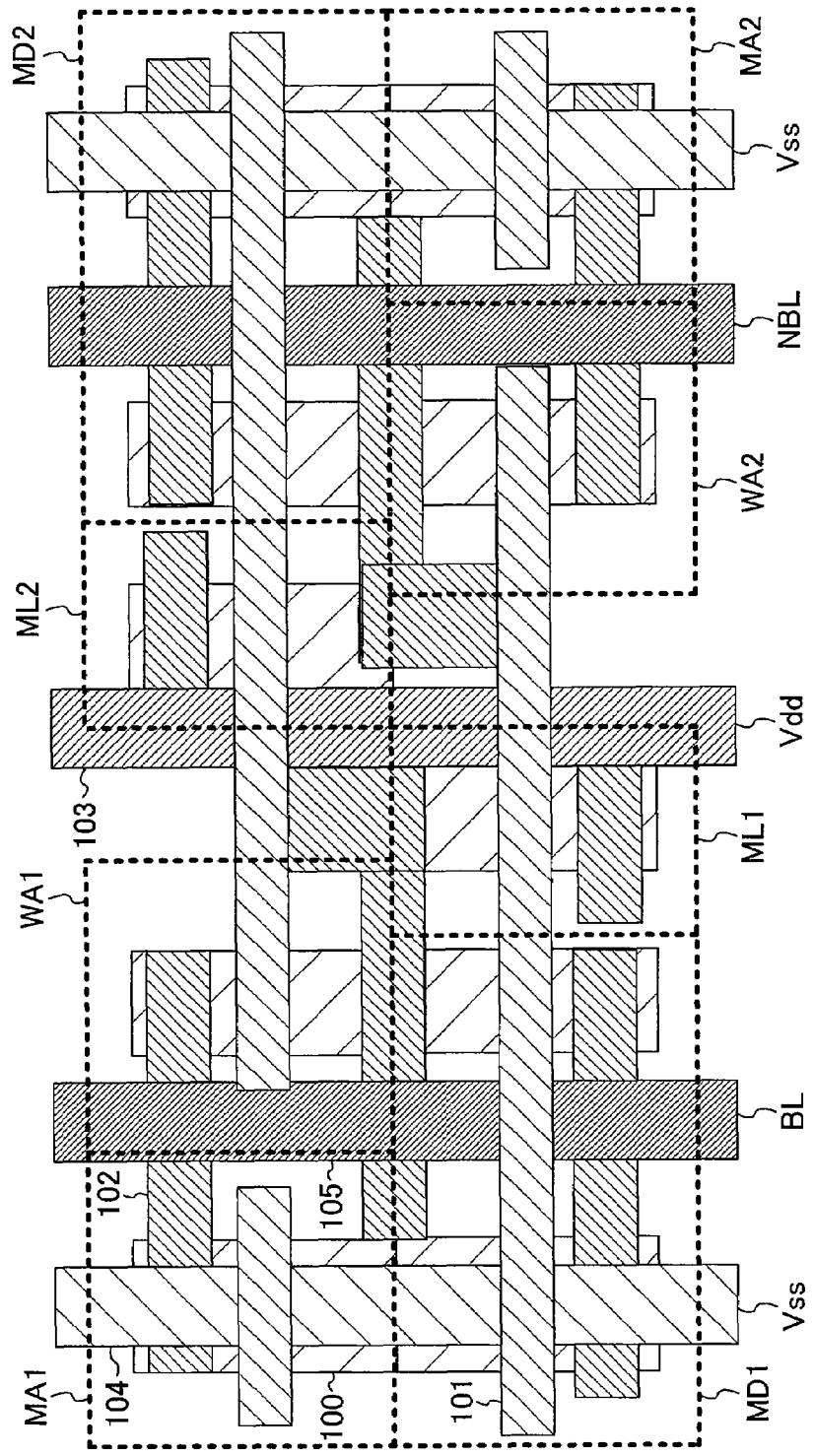
FIG. 25 is a plan view showing a second schematic exemplary configuration (layout) of the memory cell of FIG. 11.

FIGS. 24 and 25 show second schematic exemplary configurations (layouts) of the memory cells 20 and 50 of FIGS. 1 and 11. FIGS. 24 and 25 are different from FIGS. 22 and 23 in that the first drive transistor MD1 is divided into parallel transistors.

In this configuration, diffusions of the first and third access transistors MA1 and WA1 and a diffusion of the first drive transistor MD1 are in substantially a straight line in the memory cell row direction. Therefore, independent diffusion patterns in a memory cell are reduced, leading to a reduction in defective characteristics. Therefore, the yield can be improved.

Further, in this configuration, the diffusions of the first and third access transistors MA1 and WA1 and the diffusion of the first drive transistor MD1 are in substantially a straight line in the memory cell row direction, and the diffusion of the first access transistor MA1 and the diffusion of the first drive transistor MD1 are in substantially a straight line in the memory cell column direction. Therefore, diffusion patterns can be easily formed, so that the yield can be improved.

Figure 26:
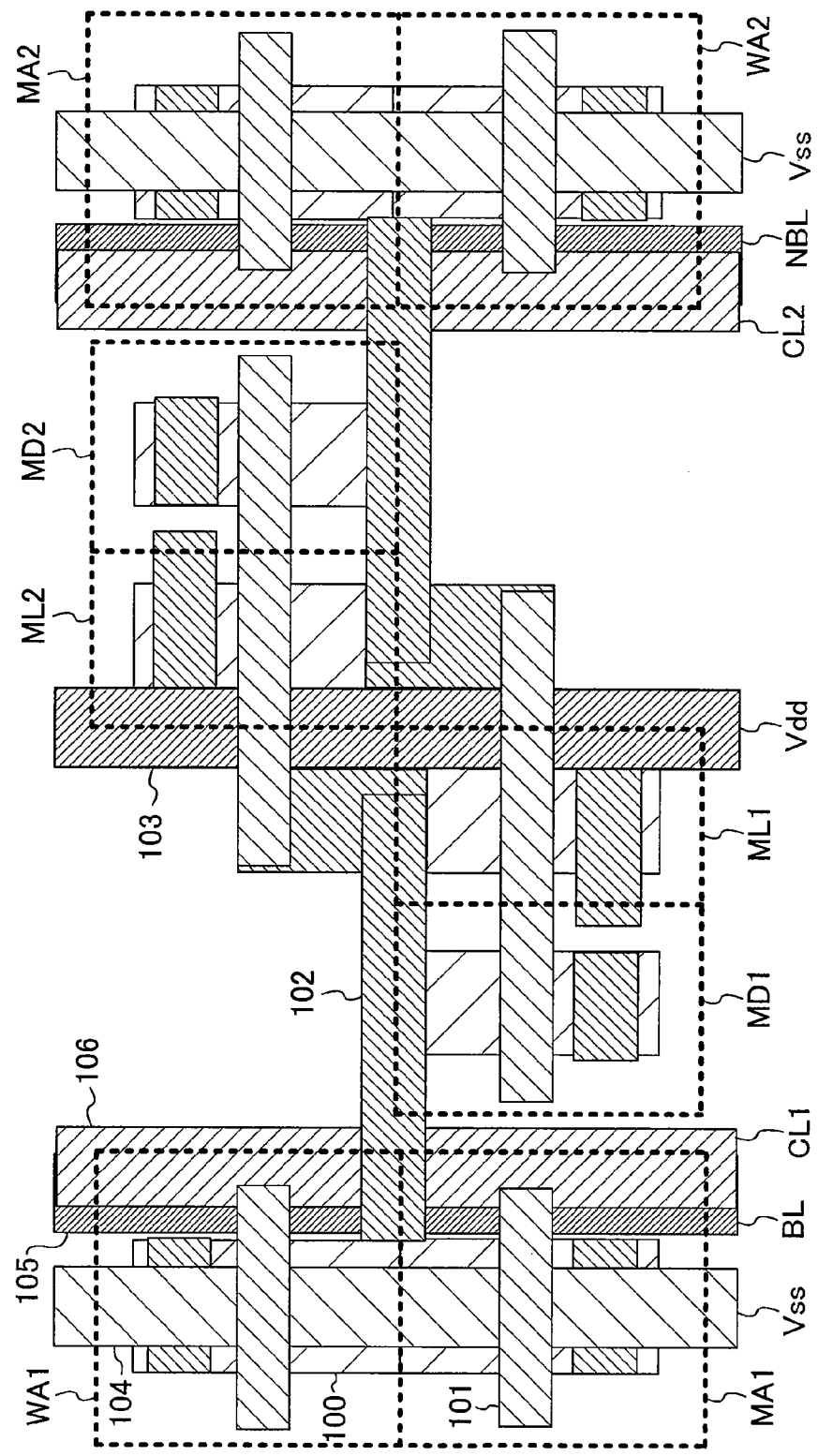
FIG. 26 is a plan view showing a third schematic exemplary configuration (layout) of the memory cell of FIG. 1.
Figure 27:
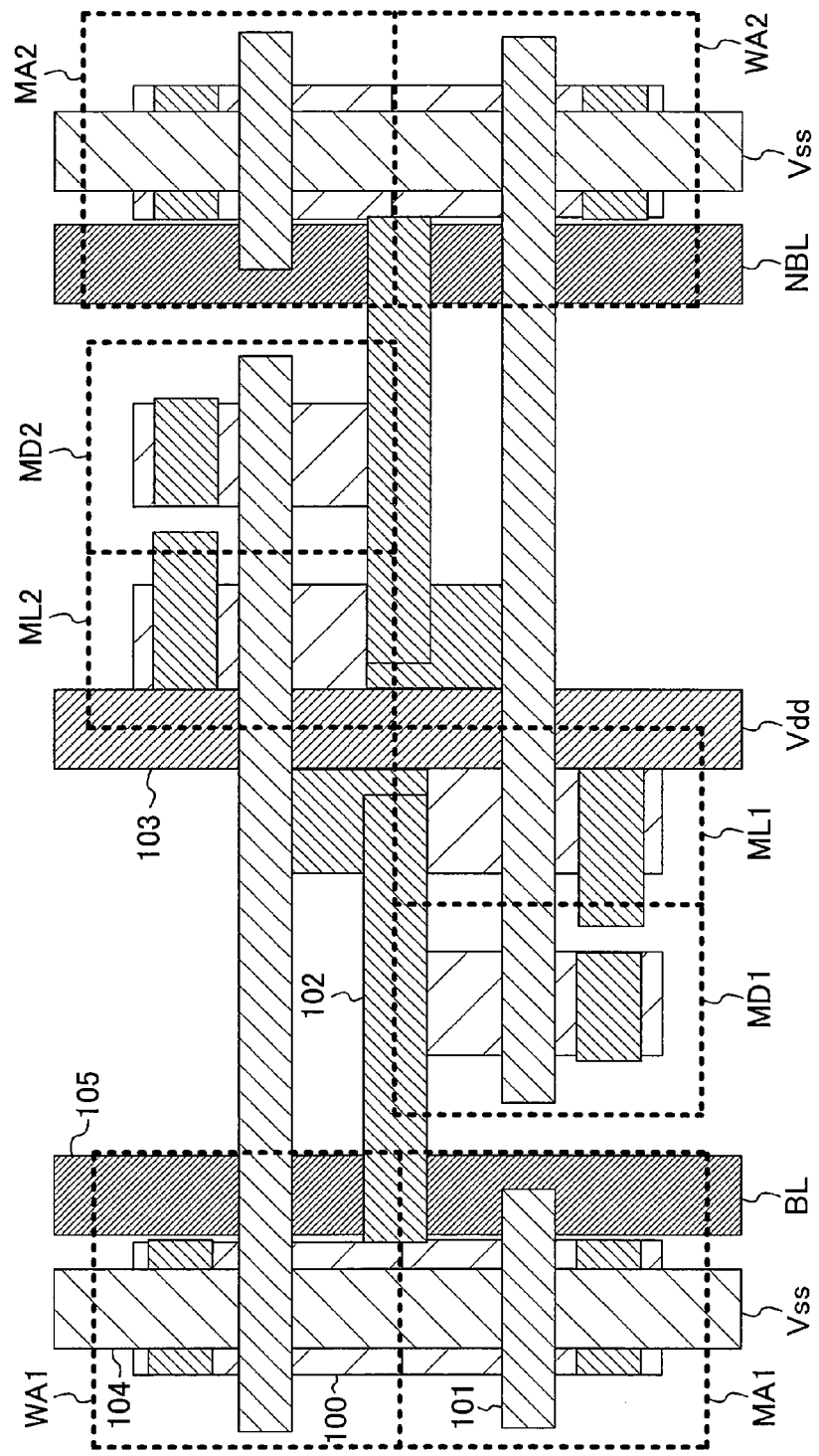
FIG. 27 is a plan view showing a third schematic exemplary configuration (layout) of the memory cell of FIG. 11.

FIGS. 26 and 27 show third schematic exemplary configurations (layouts) of the memory cells 20 and 50 of FIGS. 1 and 11. FIGS. 26 and 27 are different from FIGS. 24 and 25 in that the first access transistor MA1 and the third access transistor WA1 are connected to each other, sharing a diffusion.

In this configuration, a diffusion of the first access transistor MA1 and a diffusion of the third access transistor WA1 are in substantially a straight line in the memory cell row direction, so that a diffusion pattern can be easily formed, resulting in an improvement in yield.

Further, in this configuration, a distance between the diffusion of the third access transistor WA1 and a diffusion of the first load transistor ML1 is larger than a distance between the diffusion of the third access transistor WA1 and a diffusion of the first drive transistor MD1, so that a well proximity effect can be reduced, resulting in an improvement in transistor characteristics. Therefore, the yield can be improved.

Note that, in FIGS. 22 to 27, the first to fifth wiring layers 102 to 106 may be the same wiring layer.

As described above, the semiconductor memory device of the present invention can prevent an erroneous operation in a non-selected column even when a plurality of columns of memory cells are connected to one input/output circuit, while expanding an operating voltage margin during a write operation, and contributes to a reduction in area of an SRAM, and is useful particularly as a cache memory for a microprocessor or the like.

Although the embodiments of the present invention have been described, the present invention is not limited to the above-described embodiments. Various changes and modifications can be made without departing from the spirit and scope of the invention. For example, positive and negative logics in a circuit may be changed as appropriate.

What is claimed is:

1. A semiconductor memory device comprising:
a memory cell array including a plurality of memory cells arranged in a matrix of rows and columns;
a plurality of word lines provided with respect to the rows of the memory cells, including a first word line;
a plurality of bit lines provided with respect to the columns of the memory cells, including a first and a second bit line; and
a plurality of column lines provided with respect to the columns of the memory cells, including a first and a second column line,
wherein each of the memory cells includes:
a first access transistor provided between the corresponding first bit line of the bit lines and a first memory node, and controlled by the corresponding first word line of the word lines;
a second access transistor provided between the corresponding second bit line of the bit lines and a second memory node, and controlled by the first word line;
a latch circuit having the first and second memory nodes;
a third access transistor connected in parallel to the first access transistor, and having a gate terminal connected to the first column line; and
a fourth access transistor connected in parallel to the second access transistor, and having a gate terminal connected to the second column line.

2. The semiconductor memory device of claim 1, wherein the latch circuit includes:
a first load transistor having a drain terminal connected to the first memory node, a source terminal to which a first potential is supplied, and a gate terminal connected to the second memory node;
a second load transistor having a drain terminal connected to the second memory node, a source terminal to which the first potential is supplied, and a gate terminal connected to the first memory node;
a first drive transistor having a drain terminal connected to the first memory node, and a source terminal to which a second potential is supplied, and a gate terminal connected to the second memory node; and
a second drive transistor having a drain terminal connected to the second memory node, a source terminal to which the second potential is supplied, a gate terminal connected to the first memory node.

3. The semiconductor memory device of claim 2, further comprising:
a write circuit connected to the first bit line,
wherein the write circuit includes an N-channel MOS transistor, and
a gate width of the N-channel MOS transistors is larger than a value obtained by multiplying a gate width of the first load transistor by a quotient obtained by dividing the number of memory cells in a row direction by two.

4. The semiconductor memory device of claim 2, wherein a potential applied to the word line ranges from the first potential to the second potential, and a potential applied to the first column line ranges from a third potential to the second potential, and
the third potential is larger than the second potential.

5. The semiconductor memory device of claim 2, wherein a MOS transistor is provided between the first and second load transistors and the first potential.

6. The semiconductor memory device of claim 2, wherein a wire for supplying the first potential is provided between the first column line and the second column line.

7. The semiconductor memory device of claim 2, wherein the gate terminals of the third and fourth access transistors extend in substantially a straight line in a column direction of the memory cell.

8. The semiconductor memory device of claim 2, wherein a length in a row direction of one of the plurality of memory cells is two times as large as an interval between a middle of a gate length of the third access transistor and a middle of a gate length of the first drive transistor.

9. The semiconductor memory device of claim 2, wherein the gate terminal of the third access transistor extends in substantially a straight line in a column direction of the memory cell, and is connected to the gate terminal of the second load transistor.

10. The semiconductor memory device of claim 2, wherein a pitch width between the gate terminal of the first drive transistor and a gate terminal of the first access transistor is substantially equal to a pitch width between the gate terminal of the first access transistor and the gate terminal of the third access transistor in a row direction of the memory cell.

11. The semiconductor memory device of claim 2, wherein the first column line and the first bit line are provided in different wiring layers, and
the first column line is provided in the higher wiring layer than that of the first bit line.

12. The semiconductor memory device of claim 2, wherein diffusions of the first and third access transistors and a diffusion of the first drive transistor are in substantially a straight line in a row direction of the memory cell.

13. The semiconductor memory device of claim 2, wherein diffusions of the first and third access transistors and a diffusion of the first drive transistor are in substantially a straight line in a row direction of the memory cell, and
the diffusion of the first access transistor and the diffusion of the first drive transistor are in substantially a straight line in a column direction of the memory cell.

14. The semiconductor memory device of claim 2, wherein a diffusion of the first access transistor and a diffusion of the third access transistor are in substantially a straight line in a row direction of the memory cell.

15. The semiconductor memory device of claim 2, wherein a distance between a diffusion of the third access transistor and a diffusion of the first load transistor is larger than a distance between the diffusion of the third access transistor and a diffusion of the first drive transistor in a column direction of the memory cell.

16. The semiconductor memory device of claim 1, wherein gate lengths in a row direction of the third and fourth access transistors are larger than or equal to gate lengths in the row direction of the first and second access transistors.

17. The semiconductor memory device of claim 1, wherein gate widths in a column direction of the third and fourth access transistors are smaller than or equal to gate widths in the column direction of the first and second access transistors.

18. The semiconductor memory device of claim 1, further comprising:
a write circuit connected to the first bit line,
wherein the write circuit includes an N-channel MOS transistor and a pulse generating circuit, and
the N-channel MOS transistor receives an output signal of the pulse generating circuit.

19. The semiconductor memory device of claim 1, further comprising:
a pulse generating circuit,
wherein the first column line receives an output signal of the pulse generating circuit.

20. The semiconductor memory device of claim 1, wherein when a first control signal is input, the first and second column lines are activated.

21. The semiconductor memory device of claim 1, wherein when a first control signal is input, the first and second column lines are inactivated.

22. The semiconductor memory device of claim 1, further comprising:
a plurality of input/output circuits corresponding to the memory cell array, including a first input/output circuit,
wherein a plurality of columns of memory cells are connected to the first input/output circuit.

23. A semiconductor memory device comprising:
a memory cell array including a plurality of memory cells arranged in a matrix of rows and columns;
a plurality of word lines provided with respect to the rows of the memory cells, including a first word line; and
a plurality of bit lines provided with respect to the columns of the memory cells, including a first and a second bit line,
wherein each of the memory cells includes:
a first access transistor provided between the corresponding first bit line of the bit lines and a first memory node, and controlled by the corresponding first word line of the word lines;
a second access transistor provided between the corresponding second bit line of the bit lines and a second memory node, and controlled by the first word line;
a latch circuit having the first and second memory nodes;
a third access transistor provided between the first bit line and the first memory node, and having a gate terminal connected to the first memory node; and
a fourth access transistor provided between the second bit line and the second memory node, and having a gate terminal connected to the second memory node.

24. The semiconductor memory device of claim 23, further comprising:
a fifth access transistor provided between the first bit line and the first memory node, and having a gate terminal connected to the first word line; and
a sixth access transistor provided between the second bit line and the second memory node, and having a gate terminal connected to the first word line,
wherein the third access transistor and the fifth access transistor are connected in series, and
the fourth access transistor and the sixth access transistor are connected in series.

25. The semiconductor memory device of claim 23, further comprising:
a fifth access transistor provided between the first bit line and the first memory node, and having a gate terminal connected to the second word line; and
a sixth access transistor provided between the second bit line and the second memory node, and having a gate terminal connected to the second word line,
wherein the third access transistor and the fifth access transistor are connected in series, and
the fourth access transistor and the sixth access transistor are connected in series.

26. The semiconductor memory device of claim 23, wherein
the latch circuit includes:
a first load transistor having a drain terminal connected to the first memory node, a source terminal to which a first potential is supplied, and a gate terminal connected to the second memory node;
a second load transistor having a drain terminal connected to the second memory node, a source terminal to which the first potential is supplied, and a gate terminal connected to the first memory node;
a first drive transistor having a drain terminal connected to the first memory node, a source terminal to which a second potential is supplied, and a gate terminal connected to the second memory node; and
a second drive transistor having a drain terminal connected to the second memory node, a source terminal to which the second potential is supplied, and a gate terminal connected to the first memory node.

27. The semiconductor memory device of claim 26, wherein
a wire for supplying the first potential is provided between the first column line and the second column line.

28. The semiconductor memory device of claim 26, wherein
the gate terminals of the third and fourth access transistors extend in substantially a straight line in a column direction of the memory cell.

29. The semiconductor memory device of claim 26, wherein
a length in a row direction of one of the plurality of memory cells is two times as large as an interval between a middle of a gate length of the third access transistor and a middle of a gate length of the first drive transistor.

30. The semiconductor memory device of claim 26, wherein
the gate terminal of the third access transistor extends in substantially a straight line in a column direction of the memory cell, and is connected to the gate terminal of the second load transistor.

31. The semiconductor memory device of claim 26, wherein
a pitch width between the gate terminal of the first drive transistor and a gate terminal of the first access transistor is substantially equal to a pitch width between the gate terminal of the first access transistor and the gate terminal of the third access transistor in a row direction of the memory cell.

32. The semiconductor memory device of claim 26, wherein
the first column line and the first bit line are provided in different wiring layers, and
the first column line is provided in the higher wiring layer than that of the first bit line.

33. The semiconductor memory device of claim 26, wherein
diffusions of the first and third access transistors and a diffusion of the first drive transistor are in substantially a straight line in a row direction of the memory cell.

34. The semiconductor memory device of claim 26, wherein
diffusions of the first and third access transistors and a diffusion of the first drive transistor are in substantially a straight line in a row direction of the memory cell, and
the diffusion of the first access transistor and the diffusion of the first drive transistor are in substantially a straight line in a column direction of the memory cell.

35. The semiconductor memory device of claim 26, wherein
a diffusion of the first access transistor and a diffusion of the third access transistor are in substantially a straight line in a row direction of the memory cell.

36. The semiconductor memory device of claim 26, wherein
a distance between a diffusion of the third access transistor and a diffusion of the first load transistor is larger than a distance between the diffusion of the third access transistor and a diffusion of the first drive transistor in a column direction of the memory cell.

* * * * *